(12) United States Patent
Kobayashi et al.

(10) Patent No.: US 9,123,603 B2
(45) Date of Patent: Sep. 1, 2015

(54) PHOTOELECTRIC CONVERSION DEVICE AND IMAGING SYSTEM

(71) Applicant: CANON KABUSHIKI KAISHA, Tokyo (JP)

(72) Inventors: Masahiro Kobayashi, Tokyo (JP); Takafumi Kishi, Kawasaki (JP); Yuichiro Yamashita, Ebina (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/252,639

(22) Filed: Apr. 14, 2014

(65) Prior Publication Data
US 2014/0225213 A1    Aug. 14, 2014

Related U.S. Application Data

(63) Continuation of application No. 13/629,239, filed on Sep. 27, 2012, now Pat. No. 8,736,005.

(30) Foreign Application Priority Data

Oct. 7, 2011 (JP) ................................. 2011-223293

(51) Int. Cl.
*H01L 27/146* (2006.01)
*H04N 5/232* (2006.01)

(52) U.S. Cl.
CPC ...... *H01L 27/14605* (2013.01); *H01L 27/1461* (2013.01); *H01L 27/14641* (2013.01); *H04N 5/23212* (2013.01); *H04N 5/23287* (2013.01); *H01L 27/14643* (2013.01)

(58) Field of Classification Search
CPC ............... H01L 27/14605; H01L 27/14641; H01L 27/14643; H01L 27/146; H04N 5/335; H04N 5/23212; H04N 5/23287
USPC .......................................... 357/443, 225, 432
See application file for complete search history.

(56) References Cited

U.S. PATENT DOCUMENTS 8,274,122 B2 *  9/2012  Shimotsusa ................... 257/432
8,767,189 B2 *  7/2014  Mase et al. ................... 356/5.01

(Continued)

FOREIGN PATENT DOCUMENTS

CN    101600058 A    12/2009
JP    2001-250931 A    9/2001

(Continued)

*Primary Examiner* — Nikolay Yushin
(74) *Attorney, Agent, or Firm* — Canon USA, Inc. IP Division

(57) ABSTRACT

In a photoelectric conversion device capable of adding signals of photoelectric conversion elements included in each of photoelectric conversion units, each of the photoelectric conversion elements includes a first semiconductor region of a first conductivity type for collecting a signal charge, a second semiconductor region of a second conductivity type is arranged between the photoelectric conversion elements arranged adjacent to each other and included in the photoelectric conversion unit, and a third semiconductor region of the second conductivity type is arranged between the photoelectric conversion elements arranged adjacent to each other among the plurality of photoelectric conversion elements and included in different photoelectric conversion units arranged adjacent to each other. An impurity concentration of the second semiconductor region is lower than an impurity concentration of the third semiconductor region.

48 Claims, 17 Drawing Sheets

(56) References Cited

U.S. PATENT DOCUMENTS

| | | |
|---|---|---|
| 2002/0121652 A1 | 9/2002 | Yamasaki |
| 2009/0045407 A1 | 2/2009 | Nagasaki |
| 2009/0250778 A1* | 10/2009 | Shimotsusa .................. 257/432 |
| 2009/0256176 A1 | 10/2009 | Kobayashi |
| 2010/0225793 A1 | 9/2010 | Matsuda |
| 2010/0231891 A1* | 9/2010 | Mase et al. .................. 356/5.01 |
| 2011/0127408 A1 | 6/2011 | Yanagita |

FOREIGN PATENT DOCUMENTS

| | | |
|---|---|---|
| JP | 2008-193527 A | 8/2008 |
| JP | 2008-270298 A | 11/2008 |
| RU | 2182405 C2 | 5/2002 |

* cited by examiner

XX01 P-TYPE SEMICONDUCTOR REGION
XX02 INSULATOR ISOLATION

PHOTOELECTRIC CONVERSION DEVICE AND IMAGING SYSTEM

CROSS-REFERENCE TO RELATED APPLICATION

This application is a Continuation of U.S. application Ser. No. 13/629,239, filed Sep. 27, 2012, which claims priority from Japanese Patent Application No. 2011-223293 filed Oct. 7, 2011, which are hereby incorporated by reference herein in their entireties.

BACKGROUND OF THE INVENTION

1. Field of the Invention

One disclosed aspect of the embodiments relates to a photoelectric conversion device. More particularly, one embodiment relates to an isolation structure between photoelectric conversion elements.

2. Description of the Related Art

Conventionally, there is a technique that processes signals generated by a plurality of photoelectric conversion elements of a photoelectric conversion device as a signal of one pixel. For example, there is a technique that detects focus based on a phase difference method by providing a plurality of photoelectric conversion elements corresponding to one microlens. According to a technique discussed in Japanese Patent Application Laid-Open No. 2001-250931, each signal of a plurality of photoelectric conversion elements that correspond to one microlens is individually read out and the focus is detected. A signal obtained by adding the signals of the plurality of photoelectric conversion elements corresponding to one microlens is regarded as a signal of one pixel.

When signals of a plurality of photoelectric conversion elements are regarded as a signal of one pixel, an appropriate signal may not be obtained when there is difference in the sensitivity of the plurality of photoelectric conversion elements or the amount of light incident on the plurality of photoelectric conversion elements. Further, since the photoelectric conversion elements are arranged adjacent to various elements, an appropriate signal may not be obtained depending on the isolation structure between the adjacent elements.

SUMMARY OF THE INVENTION

One disclosed aspect of the embodiments is directed to obtaining a desired signal when signals of a plurality of photoelectric conversion elements are used as one signal by employing an appropriate isolation structure between the photoelectric conversion elements.

According to an aspect of one embodiment, a photoelectric conversion device includes a plurality of photoelectric conversion units, each including a plurality of photoelectric conversion elements and adds signals of the plurality of photoelectric conversion elements included in each of the photoelectric conversion units. In the photoelectric conversion device, each of the plurality of photoelectric conversion elements includes a first semiconductor region of a first conductivity type for collecting a signal charge, a second semiconductor region of a second conductivity type is arranged between the first semiconductor regions of the photoelectric conversion elements arranged adjacent to each other and included in the photoelectric conversion unit, a third semiconductor region of the second conductivity type is arranged between the first semiconductor regions of the photoelectric conversion elements arranged adjacent to each other among the plurality of photoelectric conversion elements included in different photoelectric conversion units arranged adjacent to each other, and an impurity concentration of the second conductivity type of at least a portion of the second semiconductor region is lower than an impurity concentration of the second conductivity type of the third semiconductor region.

Further features and aspects of the disclosure will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the disclosure and, together with the description, serve to explain the principles of the disclosure.

DESCRIPTION OF THE EMBODIMENTS

Various exemplary embodiments, features, and aspects of the disclosure will be described in detail below with reference to the drawings. One disclosed feature of the embodiments may be described as a process which is usually depicted as a timing diagram. A timing diagram may illustrate the timing relationships of several entities, such as signals, events, etc. Although a timing diagram may describe the operations as a sequential process, some operations may be performed in parallel or concurrently. In addition, unless specifically stated, the order of the operations or timing instants may be re-arranged. Furthermore, the timing or temporal distances may not be scaled or depict the timing relationships in exact proportions.

A comparison example will be described for ease of comprehension of the exemplary embodiments.

Figure 12A:
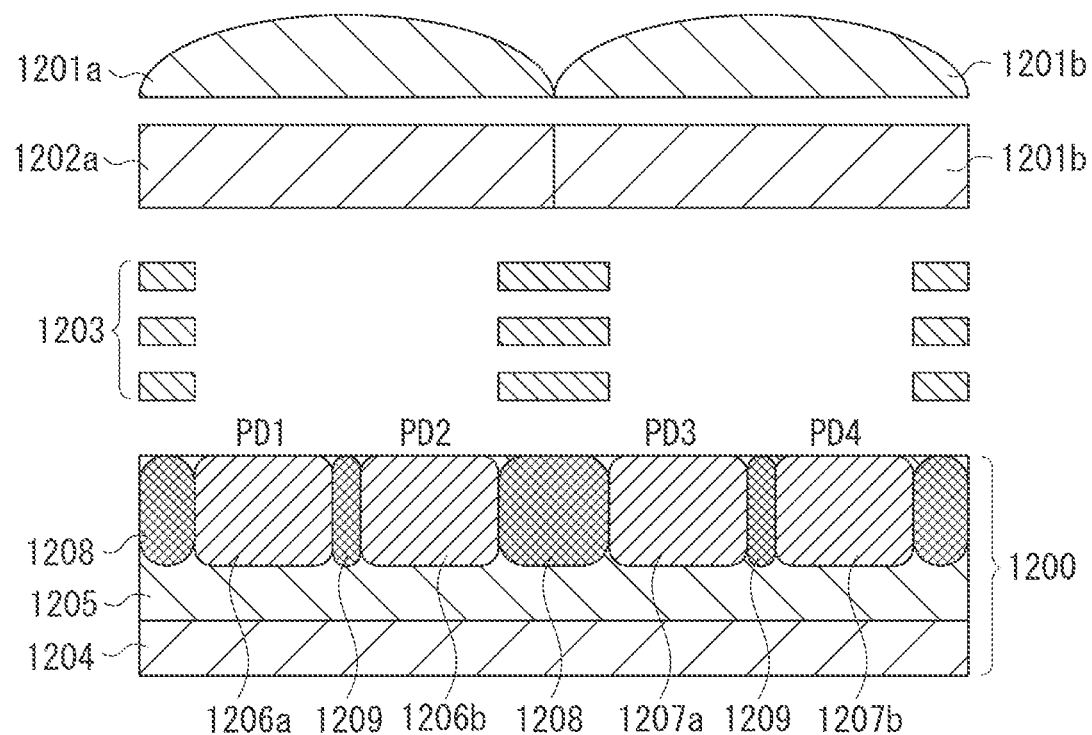
FIGS. 12A and 12B are a cross sectional view and a potential diagram of a photoelectric conversion device as a comparison example.
Figure 12B:
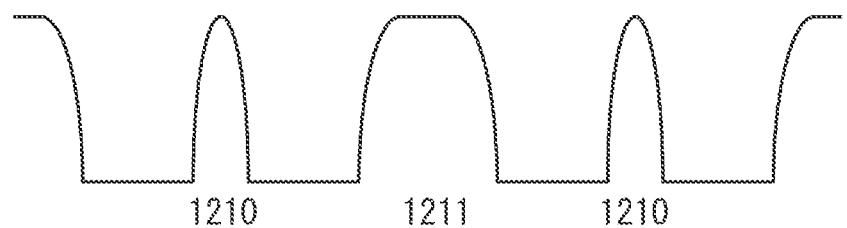

FIG. 12A is a cross sectional view of a photoelectric conversion element of a photoelectric conversion device as a comparison example. FIG. 12B is a potential diagram of signal charges and corresponds to the cross sectional view in FIG. 12A. In the descriptions below, electrons are used as the signal charges. Further, regarding a semiconductor type, an n-type semiconductor is referred to as a first conductivity type and a p-type semiconductor is referred to as a second conductivity type. If holes are used as signal charges, the first conductivity type is set to a p-type semiconductor and the second conductivity type is set to an n-type semiconductor. In the drawings, different photoelectric conversion units are denoted by different alphabets after numerical values. For example, microlenses 1201a and 1201b correspond to different photoelectric conversion units. If the photoelectric conversion units are not necessary to differentiate in the description, alphabets may not be used. The same is applied to the exemplary embodiments described below.

When light is collected by a microlens 1201, it passes through a color filter 1202. Then, the light is incident on a plurality of photoelectric conversion elements. A plurality of wiring layers 1203 are provided mainly for the purpose of obtaining signals from the photoelectric conversion elements.

A p-type semiconductor region 1205 and a plurality of n-type semiconductor regions 1206 and 1207 form a P-N junction. The p-type semiconductor region 1205 is arranged on a semiconductor region 1204. The semiconductor region 1204 may be either a p-type semiconductor substrate or an n-type semiconductor substrate.

The photoelectric conversion element includes the n-type semiconductor regions 1206 and 1207 and the p-type semiconductor region 1205. More specifically, the p-type semiconductor region 1205 and n-type semiconductor regions 1206a and 1206b constitute photoelectric conversion elements PD 1 and PD 2 (hereinafter referred to as PD 1 and PD 2). The p-type semiconductor region 1205 and n-type semiconductor regions 1207a and 1207b constitute photoelectric conversion elements PD 3 and PD 4 (hereinafter referred to as PD 3 and PD 4).

Since the potential of each of the n-type semiconductor regions 1206a, 1206b, 1207a, and 1207b is lower than the potential of the electron, signal charges are accumulated in each of the regions. A p-type semiconductor region may be arranged on the light incident side of each of the n-type semiconductor regions 1206a, 1206b, 1207a, and 1207b to form an embedded photodiode. While light condensed by a microlens 1201a is incident on the PD 1 and the PD 2, light condensed by a microlens 1201b is incident on the PD 3 and the PD 4. One photoelectric conversion unit includes a plurality of photoelectric conversion elements on which condensed light is incident by one microlens.

As described above, light condensed by one microlens 1201a is incident on the PD 1 and the PD 2. The PD 1 and the PD 2 are adjacent to each other in one direction (side to side direction in FIG. 12A). A p-type semiconductor region 1209 is arranged between the n-type semiconductor region 1206a in the PD 1 and the n-type semiconductor region 1206b in the PD 2. The p-type semiconductor region 1209 arranged between the n-type semiconductor regions 1206a and 1206b may function as a potential barrier against electron.

Condensed light is incident on the PD 2 and the PD 3 by different microlenses (the microlens 1201a for the PD 2 and the microlens 1201b for the PD 3). The PD 2 and the PD 3 are adjacent to each other in one direction (side to side direction in FIG. 12A). In other words, the PD 2 and the PD 3 are arranged adjacent to each other but are included in different photoelectric conversion units. A p-type semiconductor region 1208 is arranged between the n-type semiconductor region 1206b in the PD 2 and the n-type semiconductor region 1207a in the PD 3. The p-type semiconductor region 1208 arranged between the n-type semiconductor regions 1206b and 1207a may function as a potential barrier against electron.

FIG. 12B illustrates potential barriers 1210 and 1211 that respectively correspond to the p-type semiconductor regions 1209 and 1208. The height of the potential barrier 1210 is substantially equal to the height of the potential barrier 1211.

When the photoelectric conversion element includes the above-described structure, it is assumed a case that at least the photoelectric conversion element PD 2 included in one photoelectric conversion unit is saturated due to difference in sensitivity or luminance between the photoelectric conversion elements adjacent to each other. In such a case, some of the charges generated by the PD 2 may overflow the potential barrier 1210 and move into the adjacent photoelectric conversion element PD 1. Further, the charges generated by the PD 2 may move to the photoelectric conversion element PD 3, which is included in a different photoelectric conversion unit. Further, the charges may move to a transistor arrangement region (not illustrated) adjacent to the PD 2.

Figure 13:
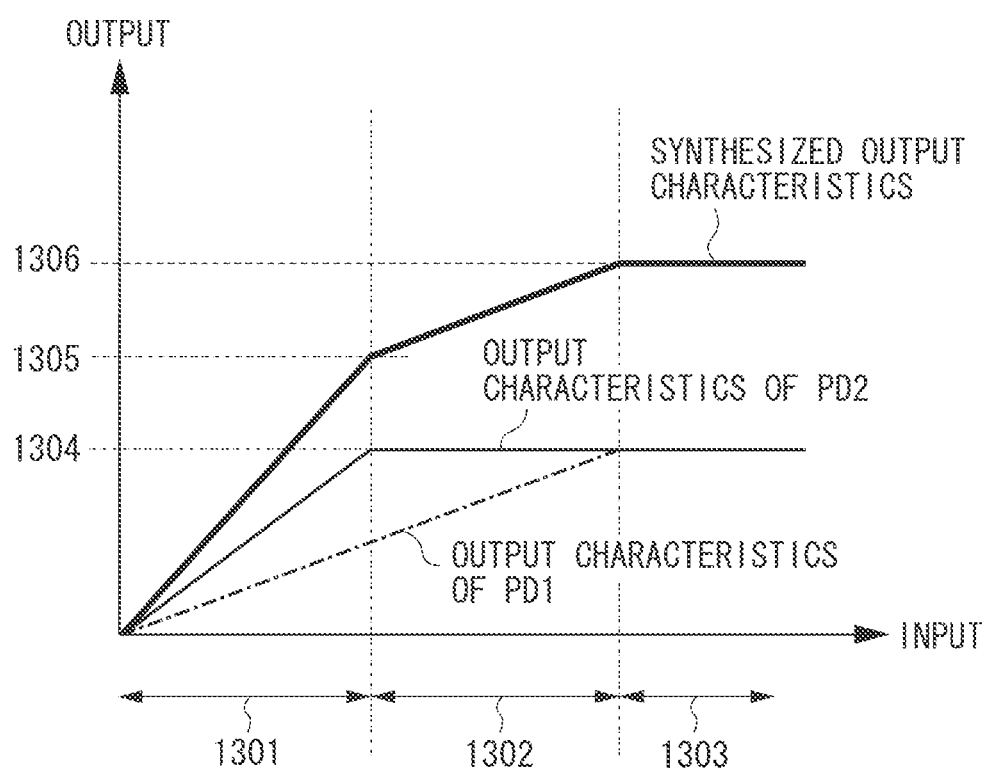
FIG. 13 schematically illustrates output of the photoelectric conversion device as the comparison example.

FIG. 13 illustrates input/output characteristics of two photoelectric conversion elements PD 1 and PD 2 included in one photoelectric conversion unit and synthesized input/output characteristics obtained by synthesizing the output of the PD 1 and the PD 2. The synthesized output may be obtained at least by adding the signals of the photoelectric conversion elements. In order to obtain the synthesized output, the signals may be averaged or amplified.

In FIG. 13, the sensitivity of the PD 2 is set to a higher level compared to the sensitivity of the PD 1 or more light is input in the PD 2 compared to the PD 1 for illustrative purposes. If the light incident on the photoelectric conversion element is in a range 1301, more charges are generated by the PD 2 than the PD 1. Since the PD 2 is not saturated, appropriate output may be obtained by synthesizing the output signals of the PD 1 and the PD 2. However, if the PD 2 is saturated and the PD 1 is not saturated, only the PD 1 outputs linear output signals with respect to the incident light. Thus, the synthesized output is determined according to the output of the PD1 from the point the PD 2 is saturated. As a result, the synthesized output shows knee characteristics from the point the PD 2 is saturated. This phenomenon becomes apparent when the charges, which have been generated after the saturation of the PD 2, flow into a region other than the PD 1. According to such phenomenon, desired synthesized signal may not be obtained.

The purpose of the present exemplary embodiment is to solve the above-described issue. Specifically, the present exemplary embodiment is characteristic in the structure of a portion between a plurality of photoelectric conversion elements in a photoelectric conversion unit as well as a portion between a plurality of photoelectric conversion elements adjacent to each other and included in different photoelectric conversion units. An impurity concentration of the p-type semiconductor region between photoelectric conversion elements which are adjacent to each other and included in one photoelectric conversion unit is set to a lower level compared to an impurity concentration of the p-type semiconductor region between photoelectric conversion elements which are adjacent to each other and included in different photoelectric conversion units.

Next, a block diagram of the photoelectric conversion device according to the present exemplary embodiment will be described. In the description below, an imaging device is used as an example of the photoelectric conversion device. However, the disclosure is also applicable to a device other than the imaging device so long as the device uses photoelectric conversion. Further, the block diagram is also applicable to other exemplary embodiments.

Figure 1:
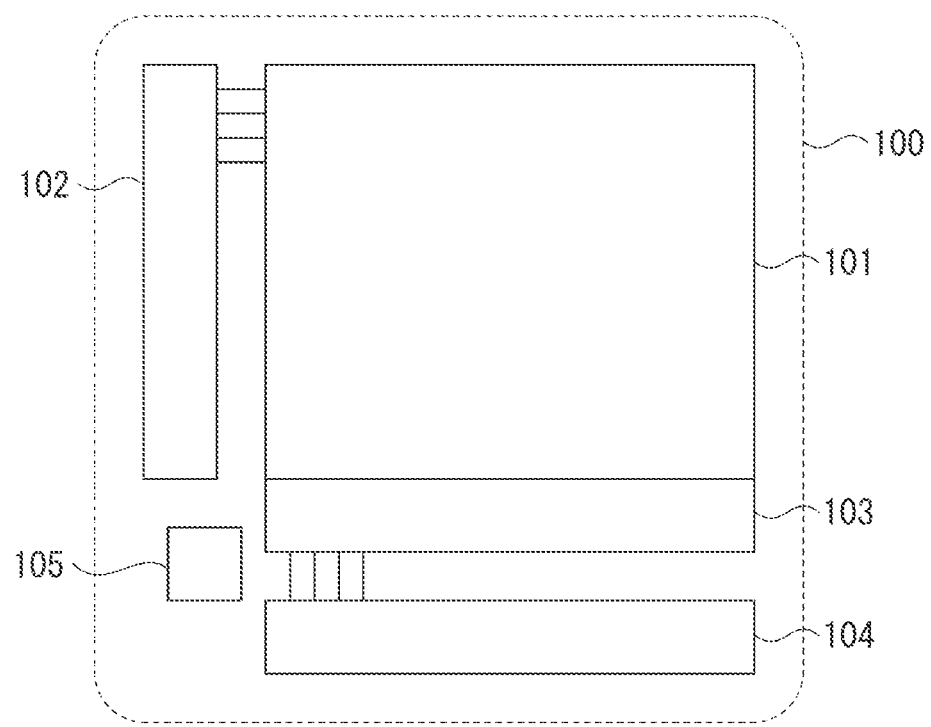
FIG. 1 is a schematic diagram of an overall configuration of an imaging device according to an exemplary embodiment.

FIG. 1 is a schematic diagram of the imaging device of the present exemplary embodiment. In FIG. 1, an imaging device 100 includes a pixel array 101 and a vertical selection circuit 102 used for selecting rows in the pixel array 101. A plurality of photoelectric conversion units are arranged in the pixel array. The plurality of photoelectric conversion units may be arranged in a two-dimensional manner.

A predetermined row is selected by the vertical selection circuit 102 and a signal is output from a photoelectric conversion unit included in the predetermined row to a vertical output line. The vertical output line may be provided for each column or a plurality of columns. Further, a plurality of vertical output lines may be provided for each pixel column.

Signals parallelly read out by a plurality of vertical output lines are input in a column circuit 103. The column circuit 103 may perform any of signal amplification, analog digital conversion, and noise reduction as well as a combination of such processing.

A horizontal selection circuit 104 sequentially selects a signal stored in the column circuit 103 and outputs the signal to a horizontal output line (not illustrated). A serial interface 105 communicates with an external device to determine, for example, the operation mode. In addition to the illustrated components, the imaging device 100 may include, for example, a timing generator or a control circuit that provides a control pulse or the like to the vertical selection circuit 102, the horizontal selection circuit 104, and the column circuit 103.

The block diagram in FIG. 1 is applicable to all the exemplary embodiments described below. Further, the terms vertical and horizontal are used for convenience and may be exchanged.

Figure 14A:
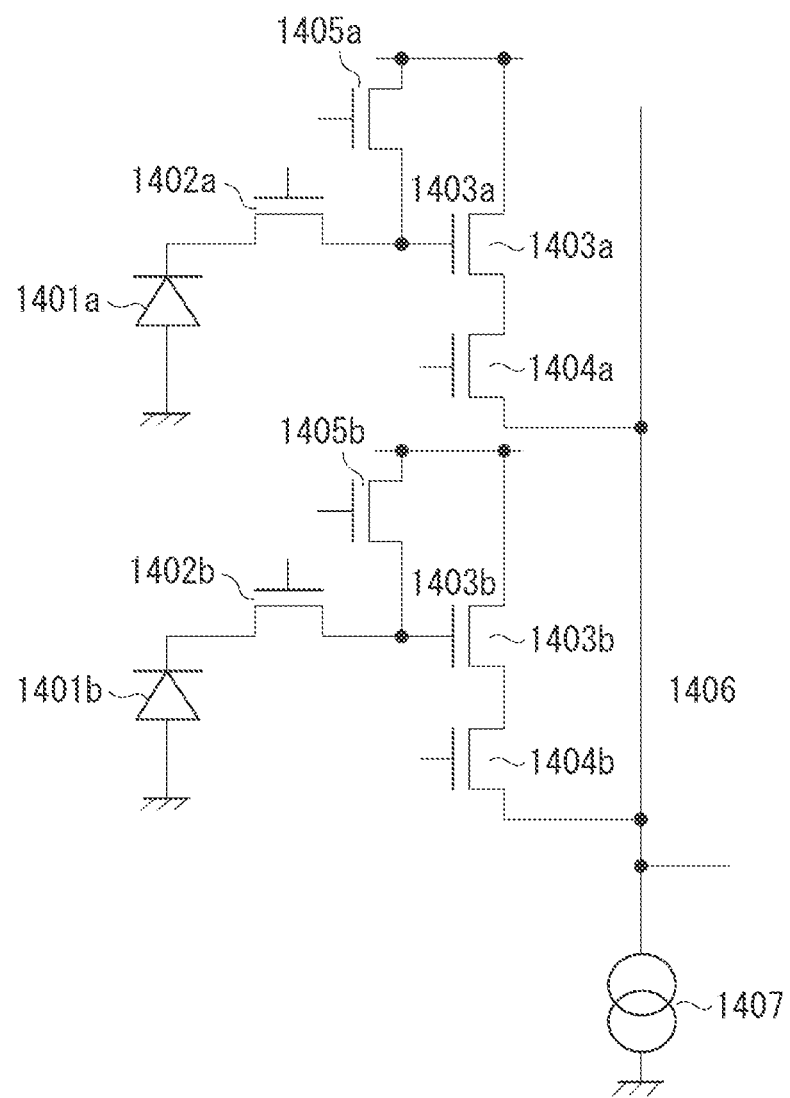
FIGS. 14A and 14B are equivalent circuit diagrams of the photoelectric conversion unit which is applicable to one embodiment.
Figure 14B:
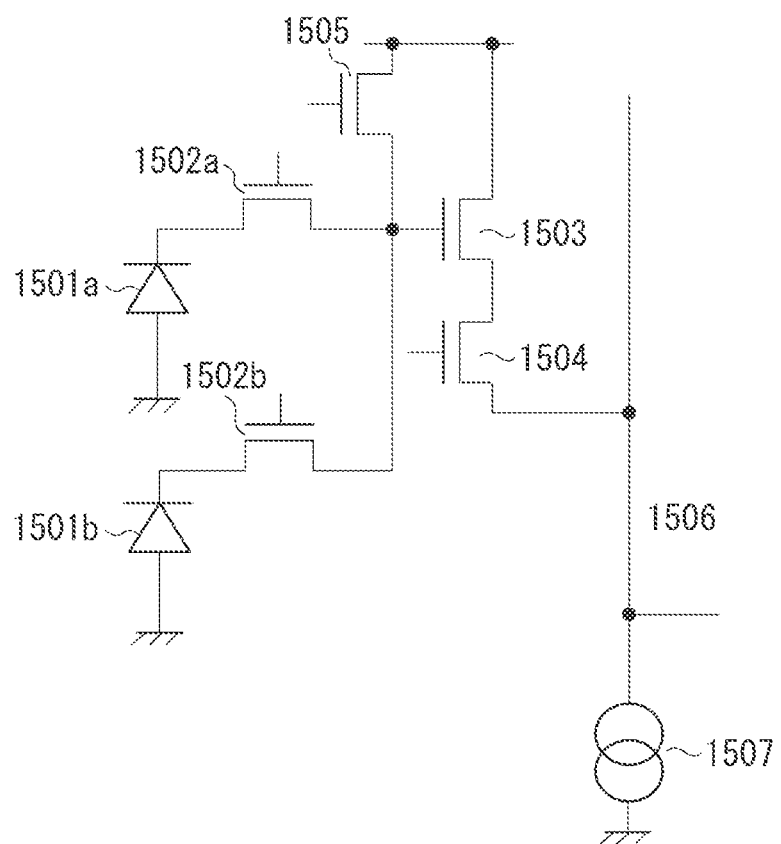

Next, examples of an equivalent circuit of the photoelectric conversion unit will be described with reference to FIGS. 14A and 14B. FIG. 14A illustrates an example where transistors, each of which has a different function, are separately provided for each photoelectric conversion element. FIG. 14B illustrates an example where transistors, each of which has a different function, are commonly provided for a plurality of photoelectric conversion elements.

Charges generated by a photoelectric conversion element 1401a or 1401b are transferred to an input node of an amplifying transistor 1403a or 1403b by a transfer transistor 1402a or 1402b, respectively. The input node of the amplifying transistor may be configured by a gate of the amplifying transistor and a floating diffusion region electrically connected to the gate. If a pulse that turns on a selection transistor is supplied to a gate of a selection transistor 1404a or 1404b, a signal corresponding to the input node of the amplifying transistor is output to a vertical output line 1406. Then, the voltage of the input node of the amplifying transistor 1403a or 1403b is set to a predetermined voltage by a reset transistor 1405a or 1405b, respectively. When the circuit includes the above-described configuration, by exclusively turning on the selection transistor 1404a or 1404b, a signal of the photoelectric conversion element 1401a or 1401b may be read out to the column circuit. Then, imaging and focus detection may be performed by adding the signals.

Next, FIG. 14B will be described. The operation in FIG. 14B is basically similar to the operation described with reference to FIG. 14A. Charges generated by a photoelectric conversion element 1501a or 1501b are transferred to an input node of an amplifying transistor 1503 by a transfer transistor 1502a or 1502b, respectively. The input node of the amplifying transistor 1503 may be configured by a gate of the amplifying transistor and a floating diffusion region electrically connected to the gate. If a pulse that turns on a selection transistor is supplied to a gate of a selection transistor 1504, a signal corresponding to the input node of the amplifying transistor 1503 is output to a vertical output line 1506. Then, the voltage of the input node of the amplifying transistor 1503 is set to a predetermined voltage by a reset transistor 1505. In FIG. 14B, since the amplifying transistor 1503 is shared by the photoelectric conversion elements 1501a and 1501b, the signals may be added at the input node of the amplifying transistor 1503. Thus, a signal obtained after the adding processing may be output from the photoelectric conversion unit to a vertical output line 1506.

Next, a configuration of the photoelectric conversion device will be described with reference to specific exemplary embodiments. In each of the exemplary embodiments below, an imaging device is used as an example of the photoelectric conversion device. In the following specification, scope of the embodiments, and drawings, a term "impurity concentration" denotes a net impurity concentration which is the impurity concentration compensated by impurity of an opposite conductivity type. That is a net concentration. A region where a p-type additive impurity concentration is higher than an n-type additive impurity concentration is considered as a p-type semiconductor region. On the contrary, a region where the n-type additive impurity concentration is higher than the p-type additive impurity concentration is considered as an n-type semiconductor region.

Figure 2:
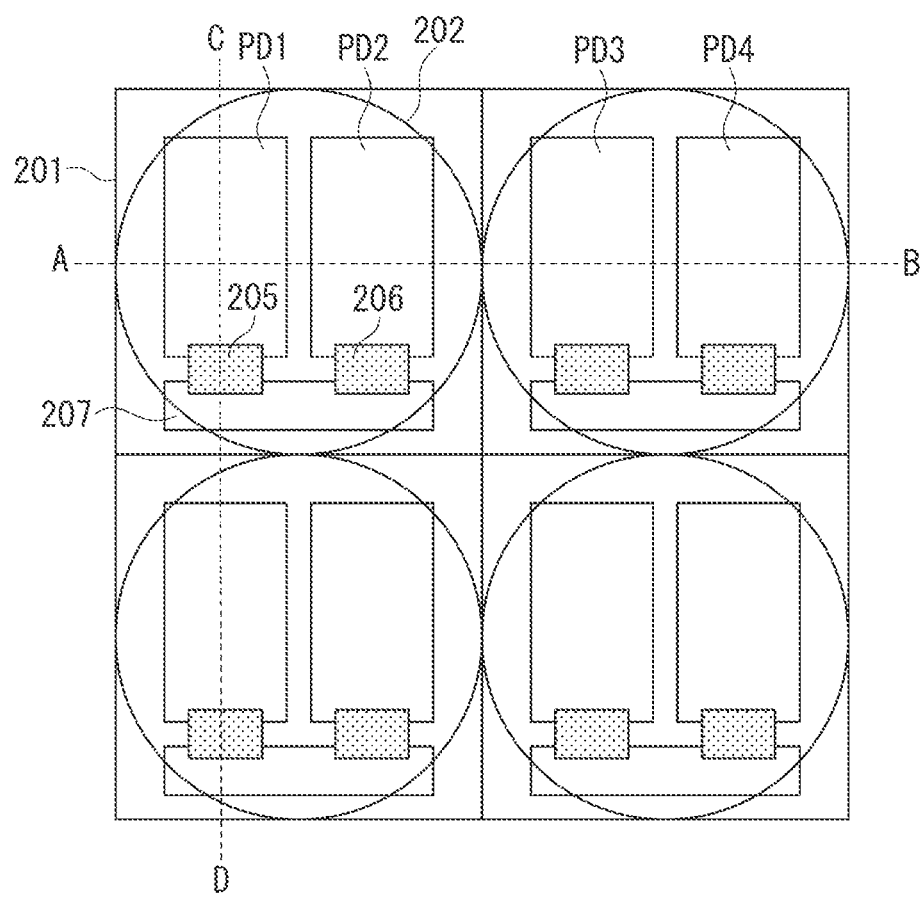
FIG. 2 is a top view of a photoelectric conversion device according to the exemplary embodiment.

FIG. 2 schematically illustrates a top view of a photoelectric conversion unit 201 of an imaging device of a first exemplary embodiment. FIG. 2 includes four photoelectric conversion units 201 arranged in two rows and two columns.

One microlens 202 is provided to each of the photoelectric conversion units. One photoelectric conversion unit 201 includes a plurality of photoelectric conversion elements. In FIG. 2, one photoelectric conversion unit 201 includes two photoelectric conversion elements, for example, the PD 1 and the PD 2. Alternatively, one photoelectric conversion unit may include four or nine photoelectric conversion elements.

The charges generated by the photoelectric conversion elements PD 1 and PD 2 are transferred to a floating diffusion region 207 via transfer gates 205 and 206 of the transfer transistors, respectively. The floating diffusion region 207 is shared by the photoelectric conversion elements PD 1 and PD 2.

Although four photoelectric conversion units are illustrated in FIG. 2 for illustrative purposes, the pixel array 101 is formed by arranging a great number of such photoelectric conversion units 201 in a matrix.

Figure 3A:
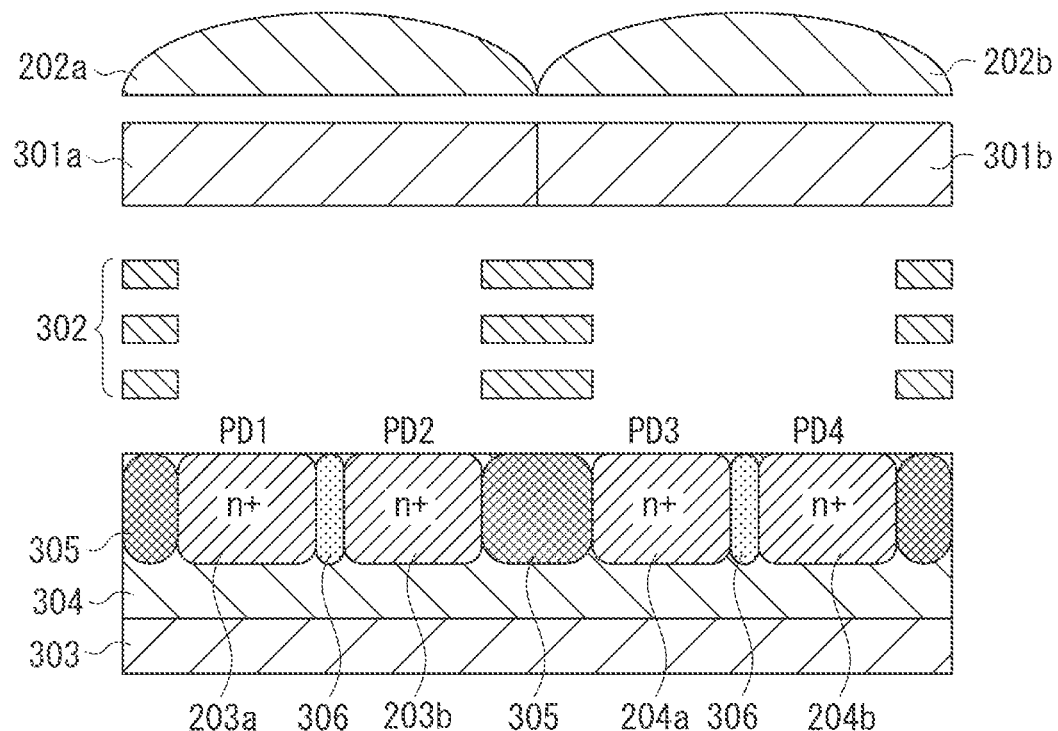
FIGS. 3A to 3C are cross sectional views and a potential diagram of the photoelectric conversion device according to the exemplary embodiment.
Figure 3B:
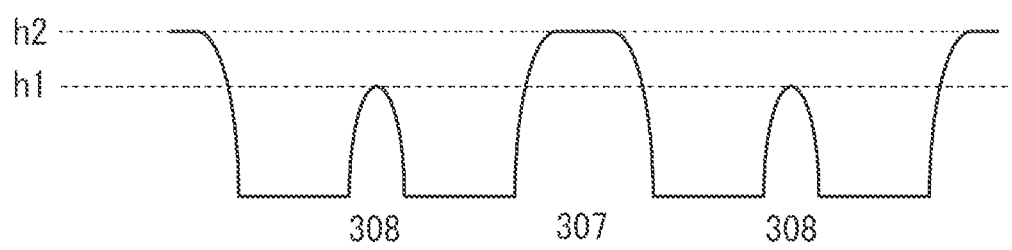
Figure 3C:
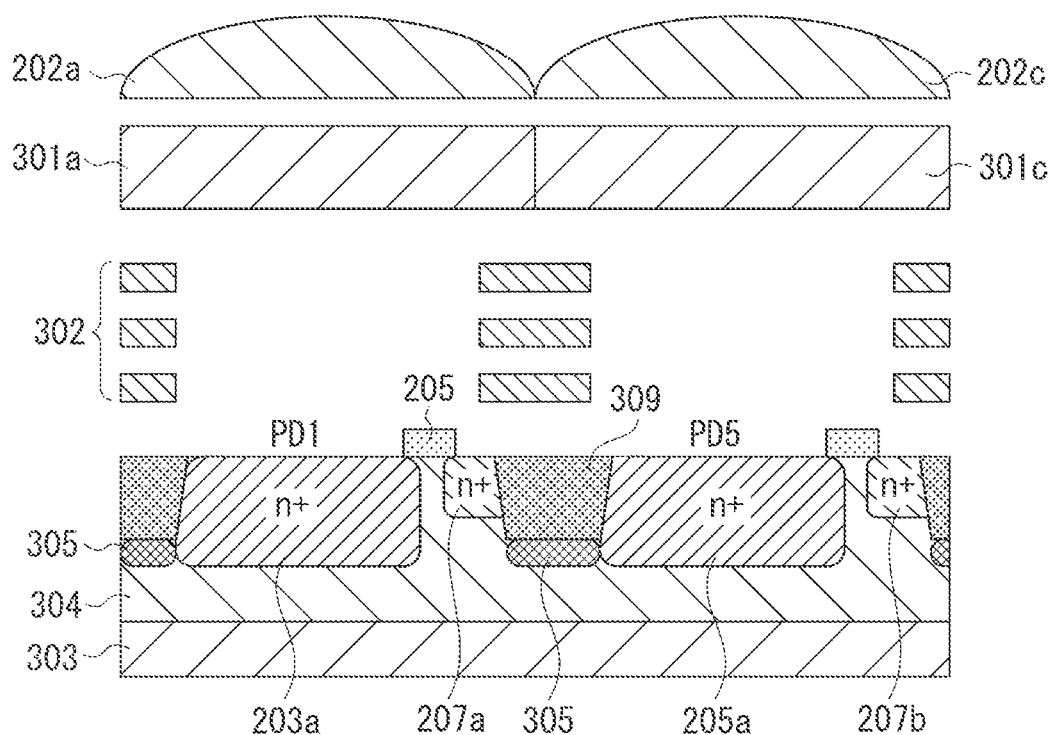

FIG. 3A is a cross sectional view of the photoelectric conversion unit of the present exemplary embodiment. FIG. 3B schematically illustrates a potential structure of the signal charges of the semiconductor region in FIG. 3A. FIG. 3A is a cross-sectional view of the photoelectric conversion unit taken along a broken line A-B in FIG. 2. FIG. 3C is a cross-sectional view of the photoelectric conversion unit taken along a broken line C-D in FIG. 2.

The photoelectric conversion unit includes a color filter 301 and a wiring layer 302. Three wiring layers provided at different heights are illustrated in FIG. 3A.

A p-type semiconductor region 304 and a plurality of n-type semiconductor regions 203 and 204 form a P-N junction. The p-type semiconductor region 304 is arranged on a semiconductor region 303. The semiconductor region 303 is either a p-type semiconductor substrate or an n-type semiconductor substrate.

The photoelectric conversion element includes the n-type semiconductor region 203 or 204 and the p-type semiconductor region 304. More specifically, the p-type semiconductor region 304 and n-type semiconductor regions 203a and 203b constitute the photoelectric conversion elements PD 1 and PD 2. The p-type semiconductor region 304 and n-type semiconductor regions 204a and 204b constitute the photoelectric conversion elements PD 3 and PD 4. Since the potential of each of the n-type semiconductor regions 203a, 203b, 204a, and 204b is lower than the potential of the electrons, signal charges are accumulated in each of the regions. A p-type semiconductor region may be arranged on the light incident side of each of the n-type semiconductor regions 203a, 203b, 204a, and 204b to form an embedded photodiode. While light condensed by a microlens 202a is incident on the PD 1 and the PD 2, light condensed by a microlens 202b is incident on the PD 3 and the PD 4. These semiconductor regions are arranged on a semiconductor substrate 300.

Light condensed by one microlens 202a is incident on the PD 1 and the PD 2. The PD 1 and the PD 2 are included in the same photoelectric conversion unit. The PD 1 and the PD 2 are adjacent to each other in one direction (side to side direction in FIG. 3A). The photoelectric conversion unit that includes the PD 1 and the PD 2 is referred to as a first photoelectric conversion unit. The photoelectric conversion unit which is adjacent to the first photoelectric conversion unit on the right side in FIG. 3A is referred to as a second photoelectric conversion unit.

A p-type semiconductor region 306 is arranged between the n-type semiconductor regions 203a and 203b respectively included in the PD 1 and the PD 2. The p-type semiconductor region 306 arranged between the n-type semiconductor regions 203a and 203b may function as a potential barrier against electron.

Condensed light is incident on the PD 2 and the PD 3 by different microlenses (the microlens 202a for the PD 2 and the microlens 202b for the PD 3). The PD 2 and the PD 3 are included in different photoelectric conversion units but are arranged adjacent to each other. The PD 2 and the PD 3 are adjacent to each other in one direction (side to side direction in FIG. 3A). A p-type semiconductor region 305 is arranged between the n-type semiconductor regions 203b in the PD 2 and the n-type semiconductor regions 204a in the PD 3. The p-type semiconductor region 305 arranged between the n-type semiconductor regions 203b and 204a may function as a potential barrier against electron.

According to the present exemplary embodiment, the impurity concentration of the p-type semiconductor region 305 is different from the impurity concentration of the p-type semiconductor region 306. More specifically, the p-type impurity concentration of the p-type semiconductor region 306 is lower the than p-type impurity concentration of the p-type semiconductor region 305. According to such concentration, the height of the potential barrier between the PD 1 and the PD 2 in one photoelectric conversion unit may be reduced compared to the height of the potential barrier between the PD 2 and the PD 3 in different photoelectric conversion units adjacent to each other.

As illustrated in FIG. 3B, a potential barrier 308 between the PD 1 and the PD 2 in the first photoelectric conversion unit has a height h1. A potential barrier 307 between the PD 2 and the PD 3 adjacent to each other and included in different photoelectric conversion units has a height h2. The height h1 of the potential barrier between the PD 1 and the PD 2 is lower than the height h2 of the potential barrier between the PD 2 and the PD 3.

According to such a structure, the signal obtained by adding the signals of the photoelectric conversion elements included in one photoelectric conversion unit will show linearity corresponding to the amount of incident light. Such configuration is applicable not only to the present exemplary embodiment but to various photoelectric conversion elements. It is especially useful when a plurality of photoelectric conversion elements, whose output is to be added, have difference in sensitivity or a saturation amount, or amount of incident light. The difference in the amount of incident light occurs in a case where, for example, uniform light is incident on the entire photoelectric conversion device but the quantity of the light actually incident on each photoelectric conversion element is different. This is likely to occur especially when light condensed by one microlens is incident on a plurality of photoelectric conversion elements which are planarly arranged at different positions.

Next, a desirable example of the impurity concentration of the p-type semiconductor region will be described. It is desirable that the p-type impurity concentration of the p-type semiconductor region 305 which configures the potential barrier 307 is set to three times or more the p-type impurity concentration of the p-type semiconductor region 306 that configures the potential barrier 308. This is because that setting of the concentration to three times or more may make a difference between the barrier heights comparable to the potential of the charges (approximately 26 mV in ambient temperature of 27° C.). By considering an operation temperature range of the photoelectric conversion device, it is more desirable that the p-type impurity concentration of the p-type semiconductor region 305 may be set to ten times or more the p-type impurity concentration of the p-type semiconductor region 306.

Next, FIG. 3C will be described. FIG. 3C is a cross-sectional view of the photoelectric conversion unit taken along a line C-D in FIG. 2. In FIG. 3C, photoelectric conversion elements of a third photoelectric conversion unit are illustrated which are adjacent to the first photoelectric conversion unit in the downward direction in FIG. 2. A dielectric isolation 309 that includes an insulator is arranged between the floating diffusion region 207 of the first photoelectric conversion unit and a photoelectric conversion element PD 5 of the third photoelectric conversion unit. A known method and structure such as local oxidation of silicon (LOCOS) and shallow trench isolation (STI) may be used in forming the dielectric isolation 309.

Although the height of the potential barrier is not illustrated, the height of the potential barrier generated by the dielectric isolation 309 is higher than the height of the potential barrier generated by the p-type semiconductor region 306. The heights of the potential barriers generated by the dielectric isolation 309 and the p-type semiconductor region 305 are arbitrary and may be arbitrarily set according to the layout of the elements. In the example illustrated in FIG. 3C, the dielectric isolation is arranged between the floating diffusion region and the photoelectric conversion element. In addition, the dielectric isolation may be provided between a transistor and a photoelectric conversion element of a pixel unit.

Figure 4:
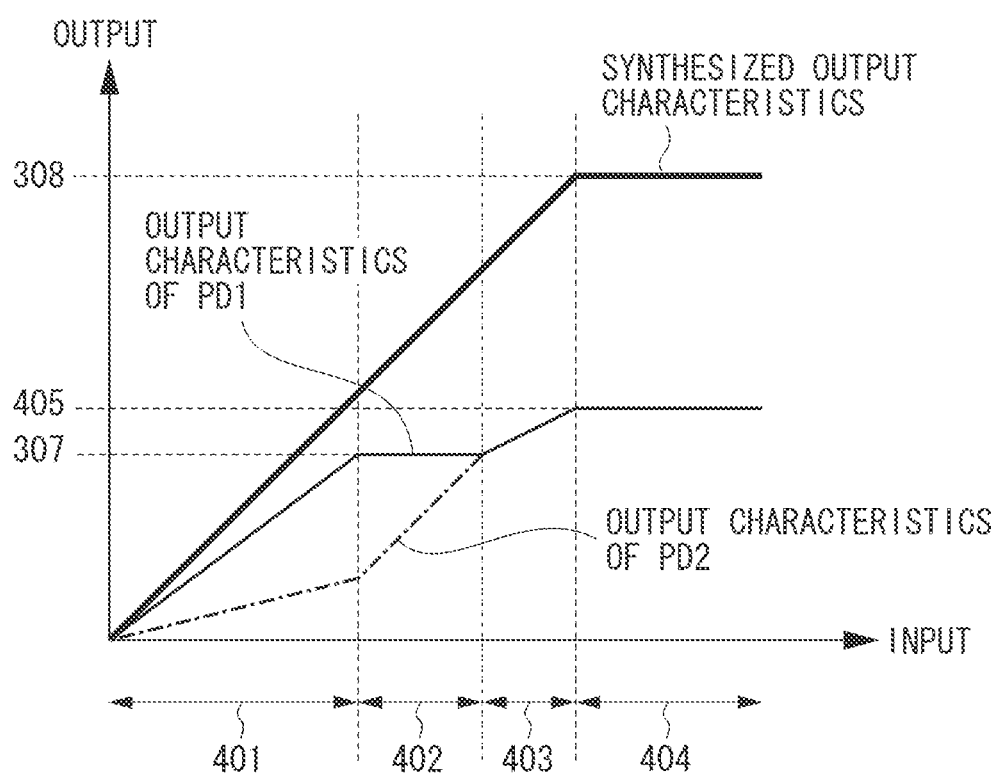
FIG. 4 schematically illustrates output of the photoelectric conversion device according to the exemplary embodiment.

Next, the output of each PD and the synthesized output after the addition will be described with reference to FIGS. 4 and 5. FIG. 4 illustrates input/output characteristics of the PD 1 and the PD 2 and synthesized input/output characteristics obtained by synthesizing the output of the PD 1 and the PD 2. The horizontal axis represents the amount of incident light and the vertical axis represents the output from the photoelectric conversion element.

Figure 5A:
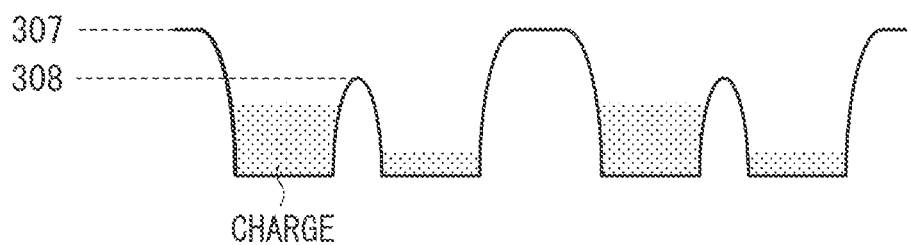
FIGS. 5A to 5D illustrate charges accumulated in the photoelectric conversion device according to the exemplary embodiment.
Figure 5B:
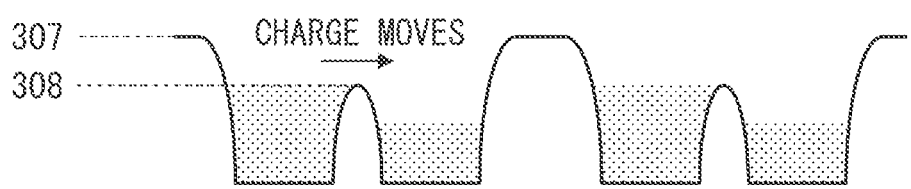

FIGS. 5A to 5D schematically illustrate a potential structure of the photoelectric conversion units illustrated in FIG. 3B and the generated electrons. In FIG. 4, it is assumed that the sensitivity of the PD 1 is set to a higher level compared to the sensitivity of the PD 2, or more light is input in the PD 1 compared to the PD 2 for illustrative purposes. When the amount of light incident on the photoelectric conversion element is within a range 401, more electrons are generated by the PD 1 than the PD 2. FIG. 5A illustrates the potential structure in such a state. The synthesized output of the PD 1 and the PD 2 indicates an appropriate value. Next, when the PD 1 and the PD 2 are in a range 402, the PD 1 is saturated but the PD 2 is not saturated. In this state, as illustrated in FIG. 5B, the electrons generated at the PD 1 may flow over the potential barrier 308 and move into the PD 2. Thus, with respect to the range 402, the output of the PD 2 is based on the charge amount obtained by synthesizing the electrons generated at the PD 2 and some of the electrons generated at the PD 1. In this manner, the height h1 of the potential barrier 308 is set lower than the height h2 of the potential barrier 307. According to such a structure, some of the electrons generated at the PD 1 may move to the PD 2. Thus, even if the amount of incident light is in the range 402, the synthesized output of the PD 1 and the PD 2 show linearity.

Figure 5C:
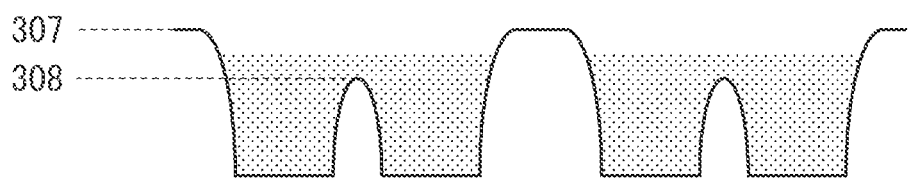

Regarding a range 403, as illustrated in FIG. 5C, both the output of the PD 1 and the PD 2 exceed the saturation level defined by the potential barrier 308, and reach the saturation level defined by the potential barrier 307.

Figure 5D:
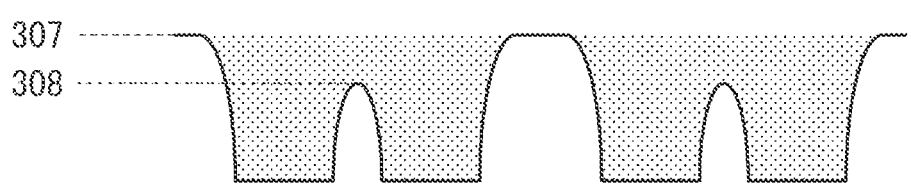

Regarding a range 404, as illustrated in FIG. 5D, since both the PD 1 and the PD 2 reach the saturation level defined by the potential barrier 307, the synthesized output is also saturated.

As described above, the present exemplary embodiment is applicable to a photoelectric conversion device including a plurality of photoelectric conversion units further including a plurality of photoelectric conversion elements. With respect to such a photoelectric conversion device, a second semiconductor region 306 of the second conductivity type is arranged between first semiconductor regions 203a and 203b of the photoelectric conversion elements which are included in one photoelectric conversion unit and arranged adjacent to each other. Further, a third semiconductor region 305 of the second conductivity type is arranged between the first semiconductor regions 203b and 204a of the photoelectric conversion elements which are arranged adjacent to each other and included in different photoelectric conversion units. The impurity concentration of the second conductivity type of the second semiconductor region 306 is set lower than the impurity concentration of the second conductivity type of the third semiconductor region 305. According to the present exemplary embodiment, the second semiconductor region 306 has a uniform impurity concentration. However, the impurity concentration does not need to be uniform so long as at least a portion of the second semiconductor region 306 includes a low concentration region.

According to such configuration, charges between photoelectric conversion elements in one photoelectric conversion unit may move more easily compared to charges which moves between the photoelectric conversion element and a different region. Thus, for example, when one photoelectric conversion element in one photoelectric conversion unit is saturated, the occurrence of the knee characteristics of the synthesized output may be prevented and output with higher linearity may be obtained.

Figure 6A:
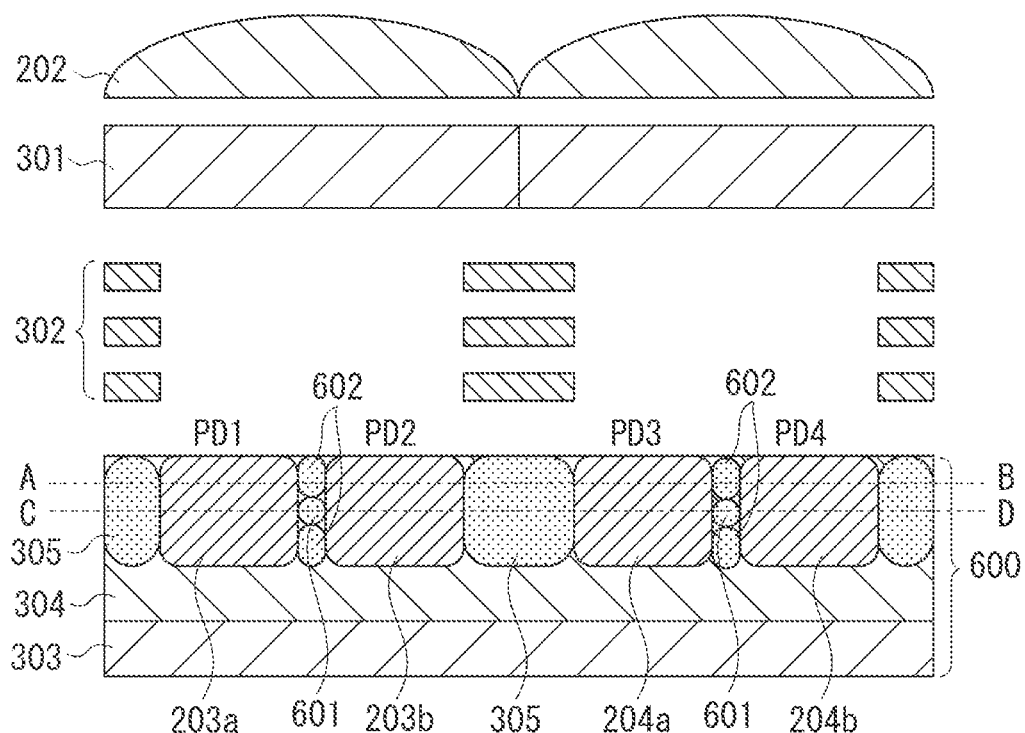
FIGS. 6A to 6C are a cross sectional view and potential diagrams of the photoelectric conversion device according to the exemplary embodiment.
Figure 6B:
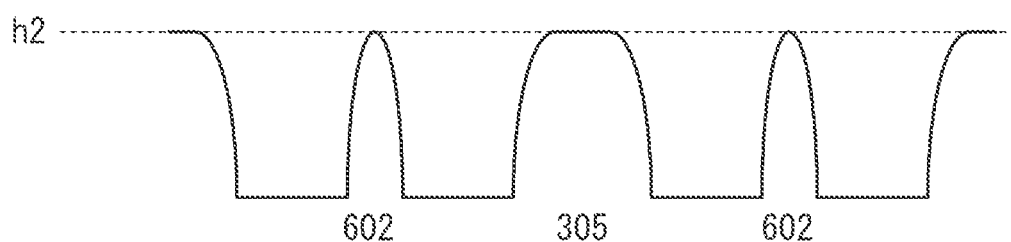
Figure 6C:
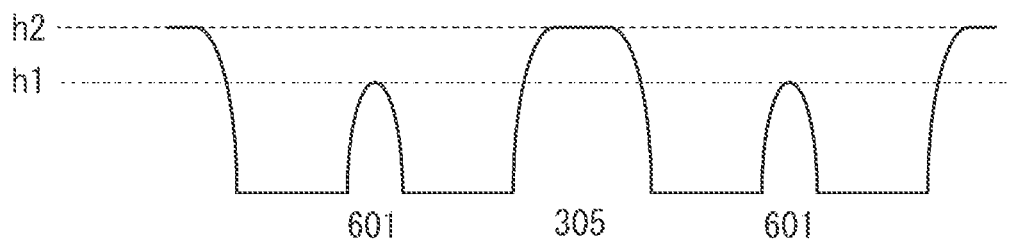

A second exemplary embodiment will be described with reference to drawings. FIG. 6A is a cross sectional view of the photoelectric conversion units of the present exemplary embodiment. Components similar to those of the first exemplary embodiment are denoted by the same reference numerals and their descriptions are not repeated. FIG. 6A is a cross-sectional view taken along the broken line A-B in FIG. 2. As for a cross-sectional view taken along the broken line C-D in FIG. 2, it is similar to the configuration illustrated in FIG. 3C. The same may be applied to the following exemplary embodiments.

The second exemplary embodiment is different from the first exemplary embodiment in that the p-type semiconductor region arranged between the photoelectric conversion elements in one photoelectric conversion unit includes a first portion having a low concentration and a second portion having a higher concentration than the first portion. More specifically, the p-type semiconductor region arranged between the PDs and where the light condensed by one microlens is incident on includes a first portion 601 with a low concentration and a second portion 602 with a higher concentration than the first portion 601. The first portion 601 may be arranged at a predetermined depth from the surface of a semiconductor substrate 600. The second portion 602 may be arranged on the top and bottom of the first portion 601. Further, the p-type impurity concentration of the first portion 601 is lower than the p-type impurity concentration of the p-type semiconductor region 305. As a specific desirable example of the impurity concentration, the impurity concentration of the p-type semiconductor region 305 is set to three times or more the p-type impurity concentration of the first portion 601. It is further desirable to set the impurity concentration of the p-type semiconductor region 305 to ten times or more the p-type impurity concentration of the first portion 601. An effect similar to the effect obtained from the first exemplary embodiment may be obtained from such a structure. Although only one first portion 601 is arranged according to the present exemplary embodiment, a plurality of them may also be arranged.

By reducing the impurity concentration of the first portion 601, charges may unnecessarily move between the PD 1 and the PD 2. In such a case, it will be difficult to separately read out the signals of the PD 1 and the PD 2.

In such a case, for example, it becomes difficult to detect the phase difference and the accuracy of the focus detection may be reduced. In order to prevent such reduction in accuracy, the depth where the first portion 601 is arranged may be changed from positions of the peak impurity concentration of the n-type semiconductor regions 203 and 204.

Figure 7A:
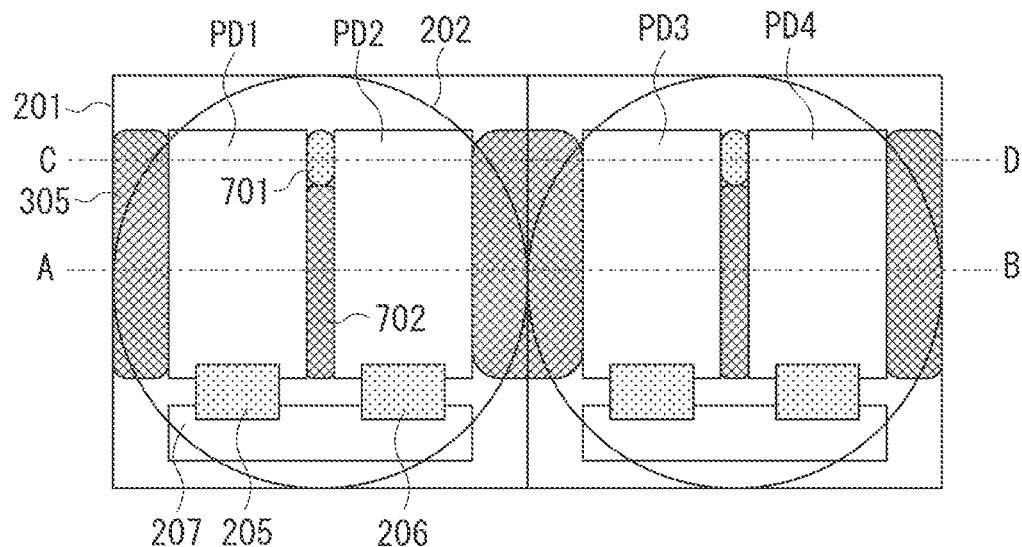
FIGS. 7A to 7C illustrate a top view and potential diagrams of the photoelectric conversion device according to the exemplary embodiment.

A third exemplary embodiment will be described with reference to drawings. FIG. 7A is a top view of the photoelectric conversion unit according to the present exemplary embodiment.

The third exemplary embodiment is different from the second exemplary embodiment in that a first portion 701 and a second portion 702 are arranged at different positions with respect to a planar view of the photoelectric conversion unit.

Figure 7B:
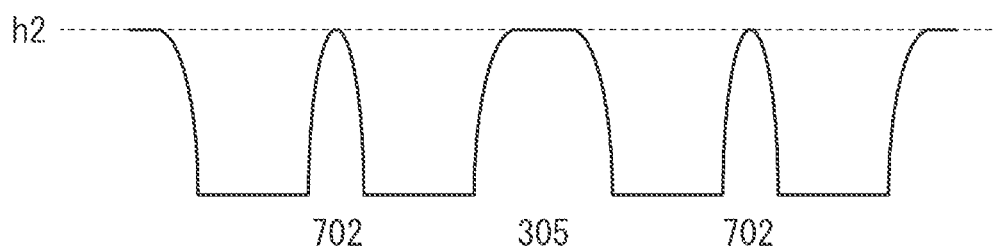
Figure 7C:
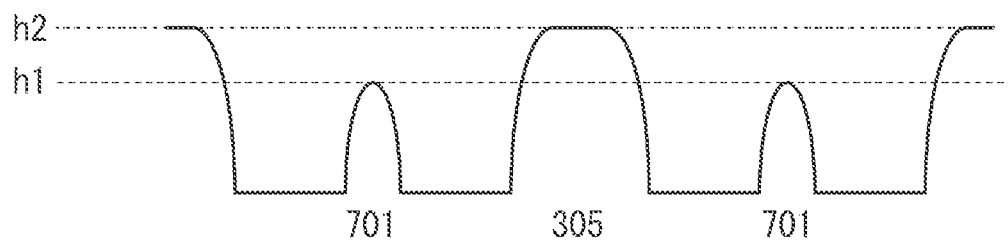

In FIG. 7A, the p-type semiconductor region arranged between the PD 1 and the PD 2 in one photoelectric conversion unit includes the first portion 701 and the second portion 702 having a higher p-type impurity concentration than the first portion 701. Further, the p-type impurity concentration of the first portion 701 is lower than the p-type impurity concentration of the p-type semiconductor region 305. FIG. 7B illustrates a potential structure of the photoelectric conversion units taken along the line A-B in FIG. 7A. FIG. 7C illustrates a potential structure of the photoelectric conversion units taken along the line C-D in FIG. 7A. As is clear from FIGS. 7B and 7C, the potential barrier formed by the first portion 701 is lower than the potential barrier formed by the second portion 702. The height of the potential barrier of the second portion 702 is the same as the height of the potential barrier of the p-type semiconductor region 305. Thus, the p-type impurity concentrations of the second portion 702 and the p-type semiconductor region 305 are equal. However, these regions do not always need to have the same impurity concentration and the potential barriers may have different heights so long as the p-type impurity concentrations of the second portion 702 and the p-type semiconductor region 305 are higher than the p-type impurity concentration of the first portion 701.

The layout of the first portion 701 is not limited to what is illustrated in FIG. 7A and a plurality of them may be separately arranged on a plane of the photoelectric conversion units.

As a desirable example of the impurity concentration, the p-type impurity concentration of the p-type semiconductor region 305 is set to three times or more the p-type impurity concentration of the first portion 701. It is further desirable to set the p-type impurity concentration of the p-type semiconductor region 305 to ten times or more the p-type impurity concentration of the first portion 701.

The potential state of the first portion 701 is easily changed according to the number of the electrons that exist in the n-type semiconductor regions 203a and 203b. Thus, the probability of whether the charges generated at the first portion 701 moves to either the PD 1 or the PD 2 is changed depending on the state immediately after the accumulation is started at the PD 1 or the PD 2 or the state in which many charges exist in one PD (e.g., the PD 1) compared to the other PD (the PD 2). For example, if a large number of charges exist at the PD 1 immediately after the accumulation is started, the potential of the first portion 701 is changed by Coulomb interaction of the charges that exist in the PD 1. Then, the charges generated at the first portion 701 are more likely to move to the PD 2. In other words, the probability of the charges moving to the PD 1 and to the PD 2 will be changed. In such a case, for example, feed-back that cancels the signal difference between the PDs used for detecting the phase difference is generated. Accordingly, the accuracy of the focus detection may be reduced.

Such reduction in accuracy may be reduced by arranging the first portion 701 as described below. More specifically, it is desirable that the position of the first portion 701 is shifted from the projection position of the center position of the microlens on the light-receiving surface of the photoelectric conversion element with respect to a planar view of the first portion 701. For example, in FIG. 7A, although the line A-B is a line segment that traverses approximately the center of the microlens, the first portion 701 is offset to the upward direction of the illustration. This arrangement is intended to separate the first portion 701 from a position where the intensity of the light condensed by the microlens reaches the peak.

Although the first portion 701 is arranged offset to the upward direction of the illustration in FIG. 7A, the first portion 701 may be arranged offset to the downward direction or to the left or right direction. A desirable offset amount of the first portion 701 is 0.1 micrometer or more from the center of the microlens. A further desirable offset amount of the first portion 701 is 0.2 micrometer or more from the center of the microlens. This is a case where the range of the wavelengths handled by the PD is in the visible light region. The wavelengths of the visible light are approximately in the range of 0.4 to 0.8 micrometer. It is an example of a case where the focus point of the microlens exists in the photoelectric conversion element.

Further, since the state of the condensed light at the photoelectric conversion element depends also on an F-number of an objective lens, a larger offset value will be desirable when the photoelectric conversion device is applied to an optical system with a small F-number. For example, if a system with an objective lens with the F-number which may be set to 2.0 is used, light of a maximum tilt angle of 14° with respect to the perpendicular line is incident on the microlens. If the distance between the microlens and the PD is 2 μm, the focal position of the light incident on the microlens at the tilt angle of 14° is offset 0.5 μm in at least one direction from the position on the light-receiving surface of the photoelectric conversion element where the center position of the microlens is projected. In such a case, it is especially effective to arrange the first portion 701 at a position 0.5 μm or more offset from the center position of the microlens. The upper limit of the offset amount is half the pitch between the photoelectric conversion elements adjacent to each other.

A fourth exemplary embodiment will be described with reference to drawings. According to the fourth exemplary embodiment, components similar to those in the first to the third exemplary embodiments are denoted by the same reference numerals and their descriptions are not repeated.

The fourth exemplary embodiment is different from the first to the third exemplary embodiments in that the p-type semiconductor region arranged between the n-type semiconductor regions 203a and 203b includes a first portion 801 and a second portion 802, and a width of the first portion 801 is narrower than a width of the second portion 802. According to such configuration, an effect similar to the above-described exemplary embodiments may be obtained.

Figure 8A:
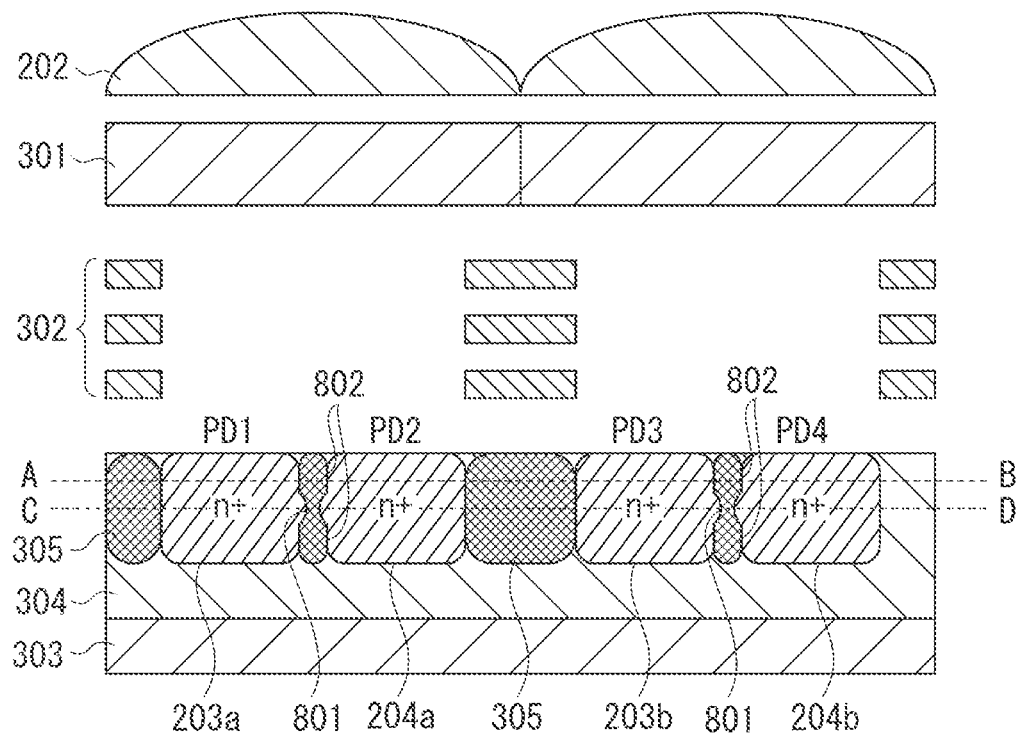
FIGS. 8A to 8C are a cross sectional view and potential diagrams of the photoelectric conversion device according to the exemplary embodiment.
Figure 8B:
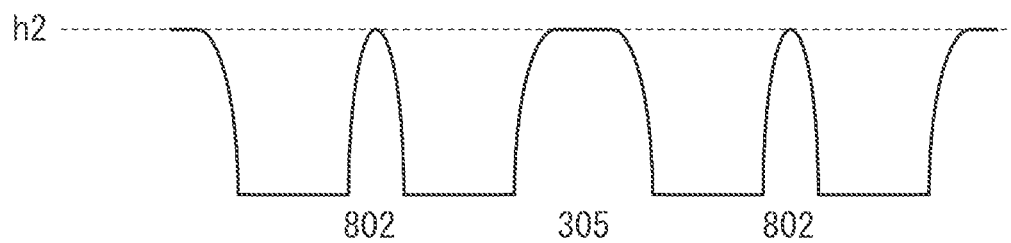
Figure 8C:
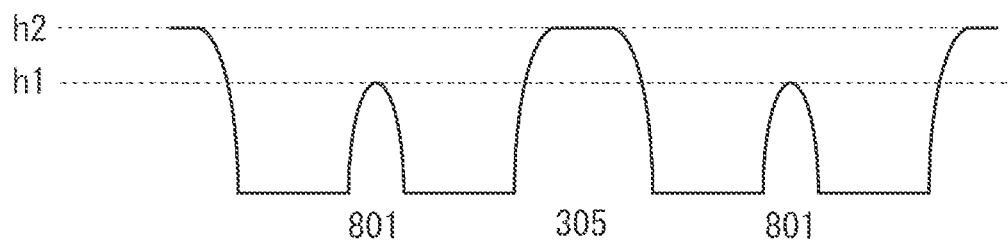

Although the first portion 801 and the second portion 802 are arranged at different depths in FIG. 8A, as is the case with the third exemplary embodiment, the first portion 801 and the second portion 802 may be arranged at the same depth but at different positions with respect to a planar view of the photoelectric conversion units. Further, the first portion 801 may include a plurality of portions separated from one another.

A fifth exemplary embodiment will be described with reference to FIGS. 15A to 15C. According to the fifth exemplary embodiment, components similar to those in the first to the fourth exemplary embodiments are denoted by the same reference numerals and their descriptions are not repeated.

The fifth exemplary embodiment is different from the first to the fourth exemplary embodiments in that an insulator isolation XX02 is arranged between the n-type semiconductor regions 203b and 204a included in different photoelectric conversion units. In addition, a p-type semiconductor region XX01 is arranged between the PD 1 and the PD 2. According to such configuration, the height of the potential barrier between the PD 1 and the PD 2 included in the same photoelectric conversion unit may be reduced compared to the height of the potential barrier of the region between the PD 3 and the PD 4 arranged adjacent to each other and included in the different photoelectric conversion units. The p-type semiconductor region 305 may be arranged at the bottom of the insulator isolation XX02. Only a p-type semiconductor region is arranged between the PD 1 and the PD 2 as is arranged with the above-described exemplary embodiments.

Figure 15A:
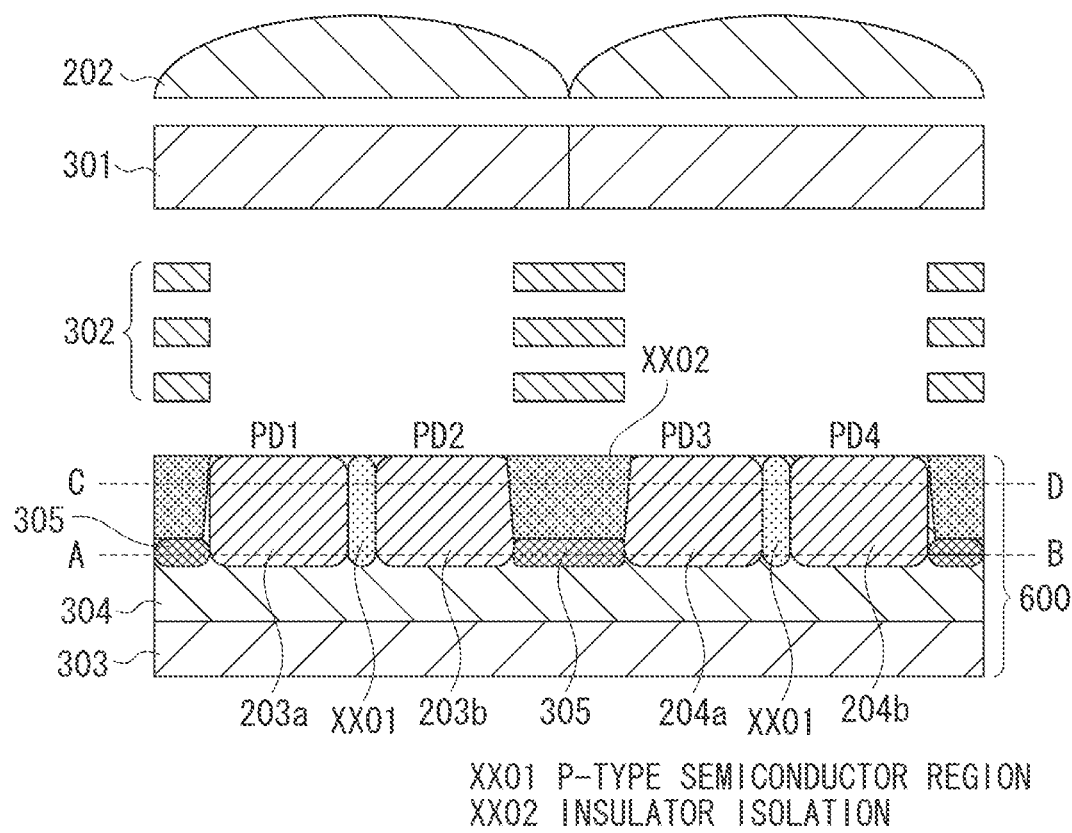
FIGS. 15A to 15C are a cross sectional view and potential diagrams of the photoelectric conversion device according to the exemplary embodiment.
Figure 15B:
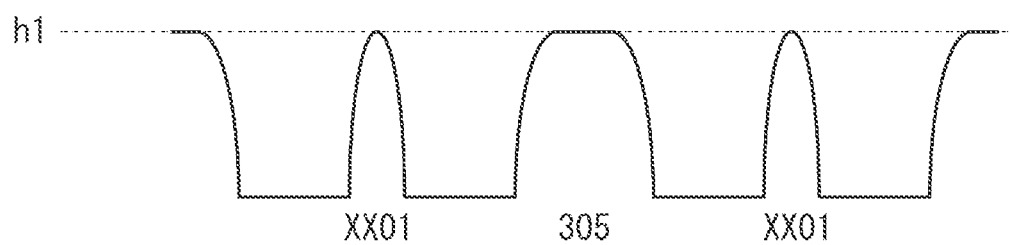
Figure 15C:
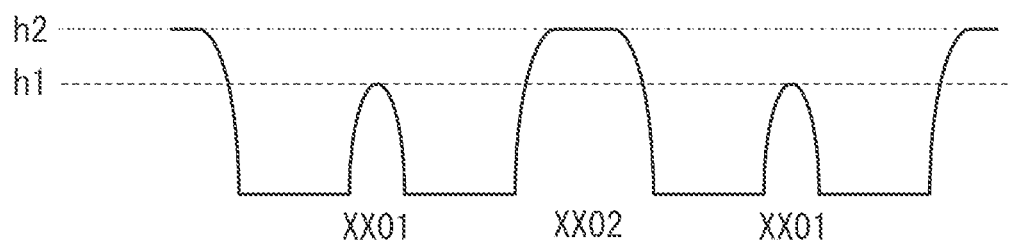

FIG. 15B is a potential diagram of the photoelectric conversion units taken along the line A-B in FIG. 15A. FIG. 15C is a potential diagram of the photoelectric conversion units taken along the line C-D in FIG. 15A. As illustrated in FIG. 15C, the height of the potential barrier between the PD 1 and the PD 2 included in the same photoelectric conversion unit is lower than the height of the potential barrier of the region between the PD 3 and the PD 4 arranged adjacent to each other and included in the different photoelectric conversion units. In FIG. 15B, the height of the potential barrier between the PD 1 and the PD 2 included in the same photoelectric conversion unit is equal to the height of the potential barrier of the region between the PD 3 and the PD 4 arranged adjacent to each other and included in the different photoelectric conversion units. Alternatively, the p-type impurity concentration of the p-type semiconductor region 305 may also be increased so that the height of the potential barrier generated by the p-type semiconductor region 305 is made higher than the height of the potential barrier generated by the p-type semiconductor region XX01. In other words, the potential barrier, which exists between the PD 2 and the PD 3, is generated by both the p-type semiconductor region 305 and the insulator isolation XX02. Further, the height of this potential barrier is increased so that it is higher than the potential barrier generated by the p-type semiconductor region XX01. In addition, instead of arranging the p-type semiconductor region 305, the p-type semiconductor region XX01 may be arranged between a plurality of photoelectric conversion elements included in a same photoelectric conversion unit and the insulator isolation XX02 may be arranged between the photoelectric conversion elements adjacent to each other and included in different photoelectric conversion units.

The photoelectric conversion device according to the above-described exemplary embodiments may be used as an imaging device or a device used for focus detection with respect to an imaging plane. An example of the focus detection which is performed when imaging is performed on an imaging plane using phase difference detection will be specifically described below with reference to FIGS. 9, 10A, and 10B.

Figure 9:
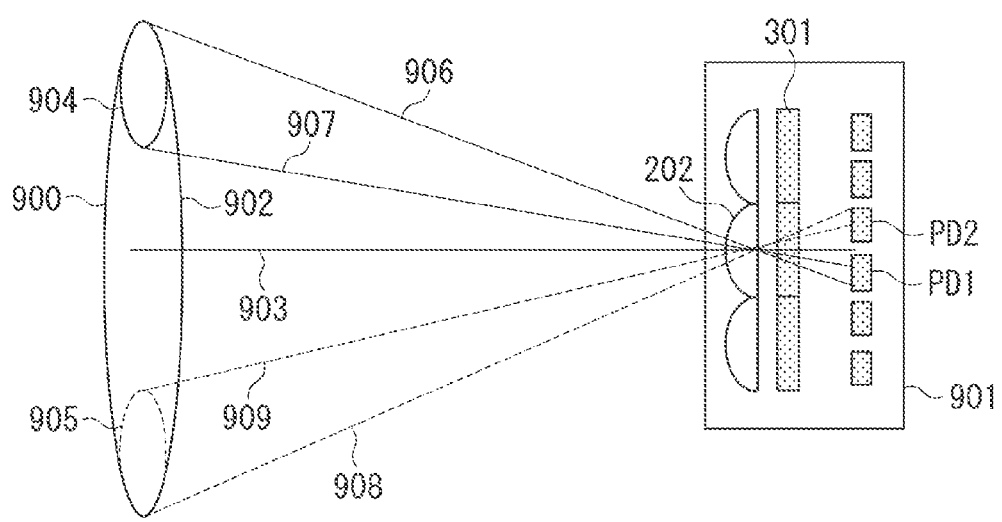
FIG. 9 schematically illustrates a relation between an object and an image of the object which is formed.

FIG. 9 is a conceptual drawing of a light flux emitted from an exit pupil of a photographic lens 900 and incident on an imaging device 901. The imaging device 901 includes a microlens 202, a color filter 301, and a plurality of photoelectric conversion elements PD1 and PD2. Light condensed by one microlens is incident on the PD 1 and the PD 2. An exit pupil 902 is an exit pupil of a photographic lens. The center of the light flux emitted from the exit pupil 902 is referred to as an optical axis 903 with respect to a photoelectric conversion unit that includes the microlens 202. The light from the exit pupil is incident on the imaging device 901 having the optical axis 903 at its center. Lines 906 and 907 represent the outermost light rays of the light that passes a region 904 which is a portion of the exit pupil 902. Similarly, lines 908 and 909 represent the outermost light rays of the light that passes a region 905 which is a portion of the exit pupil 902. As may be seen from FIG. 9, among the light fluxes emitted from the exit pupil 902, the light flux on the upper side with respect to the optical axis 903 is incident on the PD 1 and the light flux on the lower side with respect to the optical axis 903 is incident on the PD 2. Accordingly, each of the PD 1 and the PD 2 receives light emitted from a different region of the exit pupil of the photographic lens.

The phase difference is detected by using such characteristics. Regarding a region in a pixel, when the imaging region is viewed from above, data obtained from one PD is referred to as data of a first line and data obtained from the other PD is referred to as data of a second line with respect to a plurality of photoelectric conversion elements where light condensed by one microlens is incident on. Then, if correlation data between the lines is obtained, the phase may be detected.

Figure 10A:
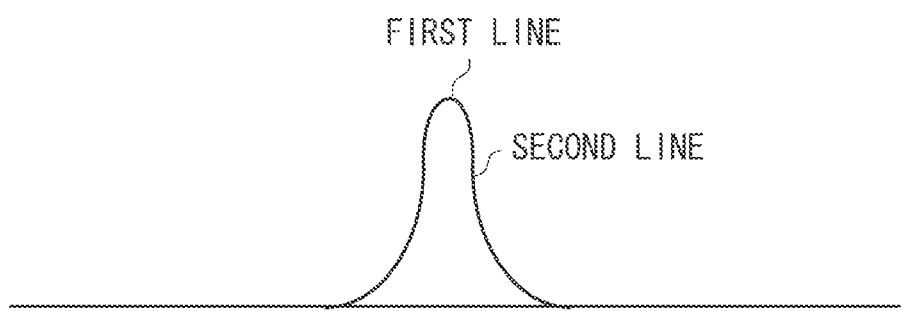
FIGS. 10A and 10B schematically illustrate focus detection based on a phase difference method.
Figure 10B:
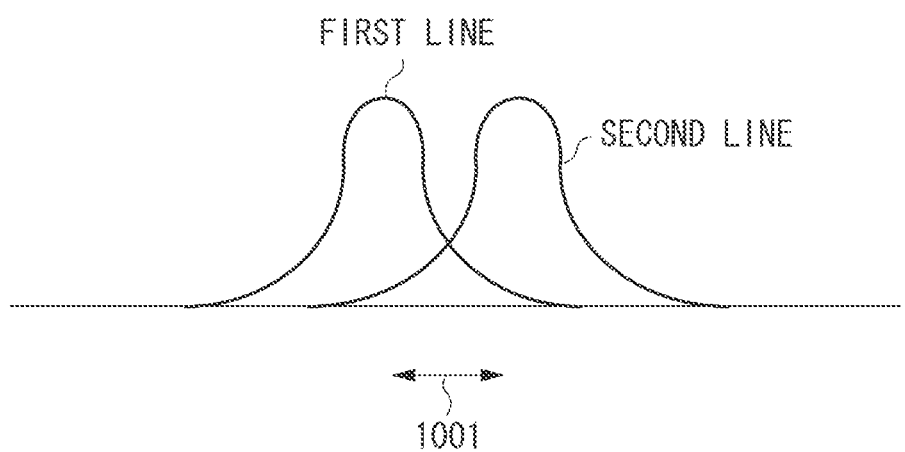

For example, in FIG. 9, among the photoelectric conversion elements on which light condensed by one microlens is incident on, data of the PD arranged on the lower side is referred to as the data of the first line, and data of the PD arranged on the upper side is referred to as the data of the second line. In this case, the PD 1 corresponds to the output of one pixel of the data of the first line, and the PD 2 corresponds to the output of one pixel of the data of the second line. FIGS. 10A and 10B illustrate the line data pieces when a point light source is used in forming an image. FIG. 10A illustrates data of the first line and the second line in an in-focus state. The horizontal axis represents pixel positions and the vertical axis represents output. In the in-focus state, the first line and the second line overlap. FIG. 10B illustrates line data pieces in an out-of-focus state. In this case, a phase difference occurs with the first line and the second line, and the pixel position is shifted. By calculating a shift amount 1001, the amount of shift with respect to the in-focus state may be obtained. Thus, the focus may be corrected by detecting the phase according to such a method and by driving the lens according to the obtained result.

Next, generation of image data by pixel arrangement as described above will be described. As described above, the correct focus may be detected by separately reading out signals of the PD 1 and the PD 2 from the imaging device 901 and performing the phase difference detection calculation. Then, by adding the signals of the PDs on which light condensed by one microlens is incident, an image to be captured may be generated.

However, if one of the PDs is saturated, in other words, if the state is as illustrated in FIG. 5B, 5C, or 5D, the signal of the PD will be different from the output separately obtained from each PD. Thus, the signal of the PD may be determined as having low reliability. In such a case, the photoelectric conversion device according to the above-described exemplary embodiments may adopt a sequence that the phase detection may not be performed or the phase detection may be stopped. More specifically, the photoelectric conversion device according to the above-described exemplary embodiments may operate by determining whether to perform the phase difference detection on the image plane of the imaging device according to the signal of the PD or charges which may be accumulated to a pre-determined amount.

Although a pixel near the center of the imaging device is described with reference to FIG. 9 above, since the difference of the amount of incident light between PDs actually increases when the pixel is in the periphery of the imaging device, if the pixel for focus detection is arranged in the outer side of the imaging area, the accuracy may be increased.

Figure 11:
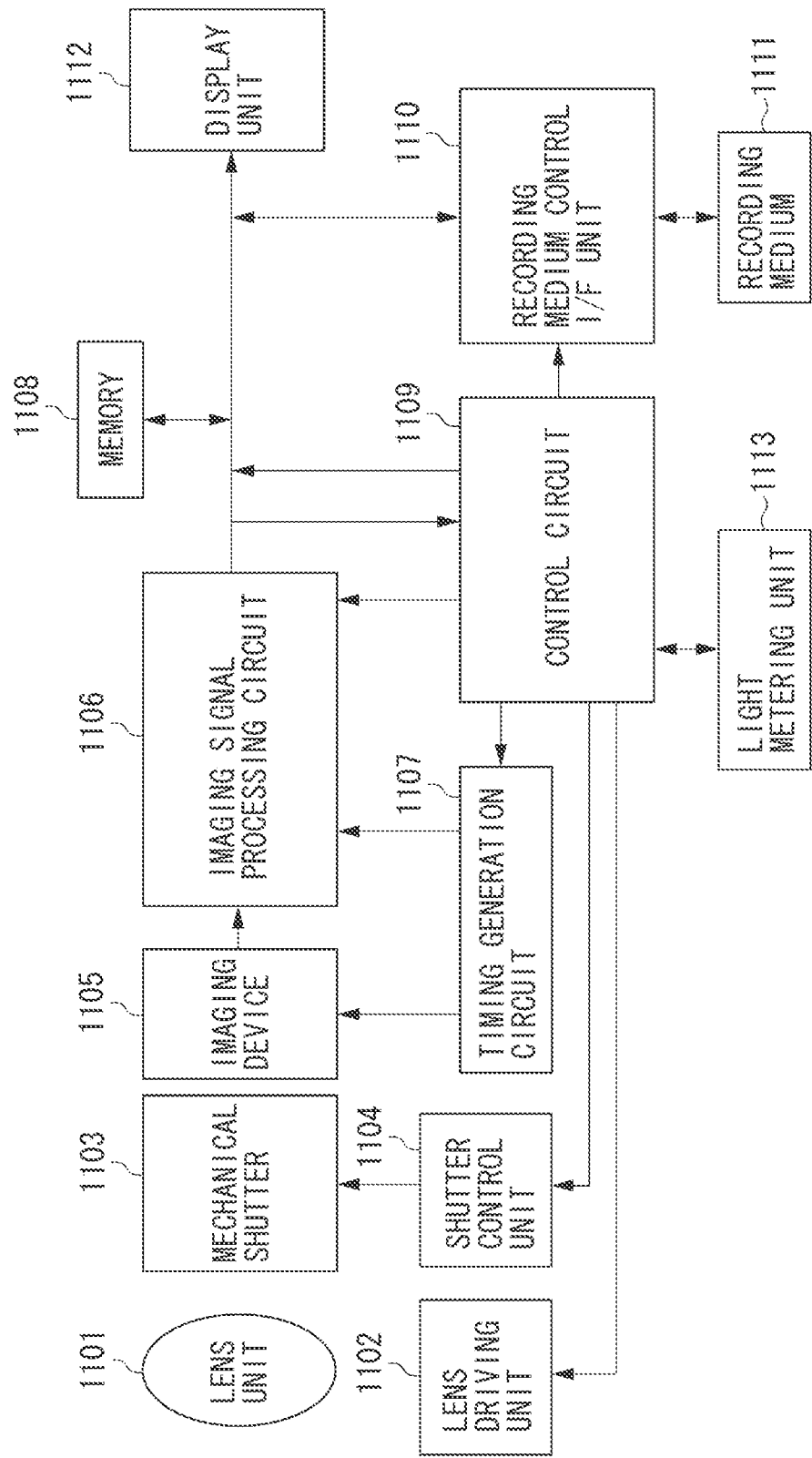
FIG. 11 is a schematic diagram of an imaging system.

FIG. 11 illustrates an example of an imaging system to which the imaging device according to each of the above-described embodiments is applicable.

In FIG. 11, a lens unit 1101 forms an optical image of an object on an imaging device 1105. A lens driving unit 1102 performs control operations such as zoom control, focus control, and diaphragm control. A mechanical shutter 1103 is controlled by a shutter control unit 1104. The imaging device 1105 captures an image of an object formed by the lens unit 1101 as an image signal. An imaging signal processing circuit 1106 performs various corrections on the image signal output from the imaging device 1105 and compresses data. A timing generation circuit 1107 serves as a driving unit which outputs various timing signals to the imaging device 1105 and the imaging signal processing circuit 1106. A control circuit 1109 controls the entire imaging device and also performs various calculations. A memory 1108 temporarily stores image data. A recording medium control interface (I/F) unit 1110 is used for recording or reading data to/from a recording medium. A recording medium 1111 is a detachable recording medium such as a semiconductor memory for recording and reading image data. A display unit 1112 displays various types of information pieces and captured images.

Next, operations performed when capturing an image by a digital camera including the above-described configurations will be described.

When the main power is turned on, the control system is powered on. Further, an imaging system circuit, such as the imaging signal processing circuit 1106, is powered on.

Then, when a release button (not illustrated) is pressed, ranging calculation is performed based on the data obtained from the imaging device 1105. Further, the control circuit 1109 calculates a distance to the object based on the result of the ranging calculation. Then, the lens driving unit 1102 drives the lens unit 1101 and it is determined whether the in-focus state is achieved. If it is determined that the in-focus state is not achieved, the lens driving unit 1102 drives the lens unit again and performs ranging. The ranging calculation may be performed not only using the data obtained from the imaging device but also by a dedicated ranging unit (not illustrated).

The imaging operation is started after the in-focus state is achieved. When the imaging operation is finished, the image signal output from the solid-state imaging device 1105 is processed by the imaging signal processing circuit 1106 and written in the memory 1108 by the control circuit 1109. The imaging signal processing circuit 1106 performs sorting processing, adding processing, and other selection processing. According to the control performed by the control circuit 1109, data pieces accumulated in the memory 1108 are recorded in the detachable recording medium 1111, such as a semiconductor memory, via the recording medium control I/F unit 1110.

Image processing may also be performed by directly inputting data in, for example, a computer via an external I/F unit (not illustrated).

While the disclosure is described with reference to exemplary embodiments, it is to be understood that the disclosure is not limited to the above-described exemplary embodiments. The scope of the following claims is to be accorded the broadest interpretation so as to encompass all modifications, equivalent structures, and functions. Although the disclosure is applicable to various photoelectric conversion elements, the configuration is especially effective in a case where there is difference in the sensitivity of the photoelectric conversion elements or the amount of light incident on the photoelectric conversion elements.

For example, in the exemplary embodiments described above, a pixel is used in the focus detection of the objective lens. However, what is characteristic of the imaging device is that output linearity is ensured when signals of a plurality of photoelectric conversion elements are added before they are read out. Thus, embodiments of the disclosure may be applied to applications other than focus detection. For example, two color filters of different bandpasses may be arranged on the plurality of photoelectric conversion elements. More specifically, in addition to a color filter of each of red (R), green (G), and blue (B) colors, a color filter of different bandpasses of R', G', and B' is used. When signals are separately read out, signals of six colors may be obtained. Accordingly, color reproducibility may be enhanced. On the other hand, if the addition of the signals of the PDs is performed to obtain signals of three colors R+R', G+G', and B+B', the sensitivity and the signal-to-noise ratio may be enhanced. These two imaging modes may be configured switchable using a same imaging device.

While the disclosure has been described with reference to exemplary embodiments, it is to be understood that the disclosure is not limited to the disclosed exemplary embodiments. The scope of the following claims is to be accorded the broadest interpretation so as to encompass all modifications, equivalent structures, and functions.

What is claimed is:

1. A photoelectric conversion device comprising:
   a plurality of photoelectric conversion units, each having a plurality of photoelectric conversion elements on which light condensed by one microlens is incident;
   wherein each of the plurality of photoelectric conversion elements includes a first semiconductor region of a first conductivity type for collecting a signal charge,
   wherein a height of a potential barrier with respect to a signal charge of at least a portion of a region between the first semiconductor regions of the photoelectric conversion elements arranged adjacent to each other and included in a one photoelectric conversion unit is lower than a height of a potential barrier arranged between the first semiconductor regions of the photoelectric conversion elements arranged adjacent to each other and each included in different photoelectric conversion units arranged adjacent to each other, and
   wherein each microlens is disposed to overlap a plurality of the first semiconductor regions contained in one pixel with respect to a planar view of the photoelectric conversion unit, and condenses light on the plurality of the first semiconductor regions.

2. The photoelectric conversion device according to claim 1, wherein
   a second semiconductor region of the second conductivity type is arranged in at least a portion between the first semiconductor regions of the photoelectric conversion elements arranged adjacent to each other and included in the one photoelectric conversion unit, and
   wherein an insulator is arranged in a region between the first semiconductor regions of the photoelectric conversion elements arranged adjacent to each other and each included in the different photoelectric conversion units arranged adjacent to each other.

3. The photoelectric conversion device according to claim 2, wherein a third semiconductor region of the second conductivity type is arranged at a lower part of the insulator.

4. The photoelectric conversion device according to claim 1,
   wherein a second semiconductor region of the second conductivity type is arranged in at least a portion between the first semiconductor regions of the photoelectric conversion elements arranged adjacent to each other and included in the one photoelectric conversion unit, and
   wherein a third semiconductor region of the second conductivity type is arranged in the region between the first semiconductor regions of the photoelectric conversion elements arranged adjacent to each other and each included in the different photoelectric conversion units arranged adjacent to each other.

5. A photoelectric conversion device comprising:
   a plurality of photoelectric conversion units, each including a plurality of photoelectric conversion elements on which light condensed by one microlens is incident;
   wherein each of the plurality of photoelectric conversion elements includes a first semiconductor region of a first conductivity type for collecting a signal charge, wherein a second semiconductor region of a second conductivity type is arranged between the first semiconductor regions of the photoelectric conversion elements arranged adjacent to each other and included in one photoelectric conversion unit, wherein a third semiconductor region of the second conductivity type is arranged between the first semiconductor regions of the photoelectric conversion elements arranged adjacent to each other and each included in different photoelectric conversion units arranged adjacent to each other, wherein an impurity concentration of the second conductivity type of at least a portion of the second semiconductor region is lower than an impurity concentration of the second conductivity type of the third semiconductor region, and wherein each microlens is disposed to overlap a plurality of the first semiconductor regions contained in one pixel with respect to a planar view of the photoelectric conversion unit, and condenses light on the plurality of the first semiconductor regions.

6. The photoelectric conversion device according to claim 5, wherein the impurity concentration of the third semiconductor region is three times or more the impurity concentration of the portion of the second semiconductor region.

7. The photoelectric conversion device according to claim 6, wherein the impurity concentration of the third semiconductor region is ten times or more the impurity concentration of the portion of the second semiconductor region.

8. The photoelectric conversion device according to claim 5, wherein the second semiconductor region includes a first portion and a second portion, and an impurity concentration of the first portion is lower than an impurity concentration of the second portion, or a width of the first portion is narrower than a width of the second portion with respect to a planar view.

9. The photoelectric conversion device according to claim 8, wherein the first portion is arranged at a depth different from a depth of the second portion.

10. The photoelectric conversion device according to claim 8, wherein the first portion is arranged at a position planarly different from the second portion with respect to a planar view of the second semiconductor region.

11. The photoelectric conversion device according to claim 8, wherein a depth of an impurity concentration peak of the first portion is different from a depth of an impurity concentration peak of the first semiconductor region.

12. The photoelectric conversion device according to claim 8, wherein the first portion is arranged offset in at least one direction with respect to a projection position of a center position of the microlens on a light-receiving surface.

13. The photoelectric conversion device according to claim 12, wherein an amount of the offset is 0.1 µm or more.

14. The photoelectric conversion device according to claim 5, wherein each of the plurality of photoelectric conversion elements is arranged at a different position with respect to a planar view of the one photoelectric conversion element.

15. An imaging device comprising:
a plurality of pixels, each having a plurality of photoelectric conversion elements, each photoelectric conversion element receiving light emitted from a different region of an exit pupil, and
a plurality of microlens;
wherein each of the plurality of photoelectric conversion elements includes a first semiconductor region of a first conductivity type for collecting a signal charge, wherein a height of a potential barrier with respect to a signal charge of at least a portion of a region between the first semiconductor regions of the photoelectric conversion elements arranged adjacent to each other and included in one pixel is lower than a height of a potential barrier arranged between the first semiconductor regions of the photoelectric conversion elements arranged adjacent to each other and each included in different pixels arranged adjacent to each other, and wherein each microlens is disposed to overlap a plurality of the first semiconductor regions contained in one pixel with respect to a planar view of the photoelectric conversion unit, and condenses light on the plurality of the first semiconductor regions.

16. The imaging device according to claim 15,
wherein a second semiconductor region of the second conductivity type is arranged in at least a portion between the first semiconductor regions of the photoelectric conversion elements arranged adjacent to each other and included in one pixel, and
wherein an insulator is arranged in a region between the first semiconductor regions of the photoelectric conversion elements arranged adjacent to each other and each included in the different pixels arranged adjacent to each other.

17. The imaging device according to claim 16, wherein a third semiconductor region of the second conductivity type is arranged at a lower part of the insulator.

18. The imaging device according to claim 15,
wherein a second semiconductor region of the second conductivity type is arranged in at least a portion between the first semiconductor regions of the photoelectric conversion elements arranged adjacent to each other and included in the one pixel, and
wherein a third semiconductor region of the second conductivity type is arranged in the region between the first semiconductor regions of the photoelectric conversion elements arranged adjacent to each other and each included in the different pixels arranged adjacent to each other.

19. An imaging device including:
a plurality of pixels, each including a plurality of photoelectric conversion elements, each photoelectric conversion element receiving light emitted from a different region of an exit pupil, and
a plurality of microlens;
wherein each of the plurality of photoelectric conversion elements includes a first semiconductor region of a first conductivity type for collecting a signal charge,
wherein a second semiconductor region of a second conductivity type is arranged between the first semiconductor regions of the photoelectric conversion elements arranged adjacent to each other and included in one pixel,
wherein a third semiconductor region of the second conductivity type is arranged between the first semiconductor regions of the photoelectric conversion elements arranged adjacent to each other and each included in different pixels arranged adjacent to each other, and
wherein an impurity concentration of the second conductivity type of at least a portion of the second semiconductor region is lower than an impurity concentration of the second conductivity type of the third semiconductor region, and
wherein each microlens is disposed to overlap a plurality of the first semiconductor regions contained in one pixel with respect to a planar view of the photoelectric conversion unit, and condenses light on the plurality of the first semiconductor regions.

20. The imaging device according to claim 19, wherein the impurity concentration of the third semiconductor region is three times or more the impurity concentration of the portion of the second semiconductor region.

21. The imaging device according to claim 20, wherein the impurity concentration of the third semiconductor region is ten times or more the impurity concentration of the portion of the second semiconductor region.

22. The imaging device according to claim 19, wherein the second semiconductor region includes a first portion and a second portion, and an impurity concentration of the first portion is lower than an impurity concentration of the second portion, or a width of the first portion is narrower than a width of the second portion with respect to a planar view.

23. The imaging device according to claim 22, wherein the first portion is arranged at a depth different from a depth of the second portion.

24. The imaging device according to claim 22, wherein the first portion is arranged at a position planarly different from the second portion with respect to a planar view of the second semiconductor region.

25. The imaging device according to claim 22, wherein a depth of an impurity concentration peak of the first portion is different from a depth of an impurity concentration peak of the first semiconductor region.

26. The imaging device according to claim 22,
wherein the first portion is arranged offset in at least one direction with respect to a projection position of a center position of a microlens on a light-receiving surface.

27. The imaging device according to claim 26, wherein an amount of the offset is 0.1 μm or more.

28. The imaging device according to claim 19, wherein each of the plurality of photoelectric conversion elements is arranged at a different position with respect to a planar view of the photoelectric conversion elements.

29. An imaging device including:
a plurality of pixels, each including a plurality of photoelectric conversion elements, and configured to perform a focus detection based on a phase difference detection at an imaging area by using signals of a plurality of photoelectric conversion elements included in one pixel, and
a plurality of microlens,
wherein each of the plurality of photoelectric conversion elements includes a first semiconductor region of a first conductivity type for collecting a signal charge,
wherein a height of a potential barrier with respect to the signal charge of at least a portion of a region between the first semiconductor regions of the photoelectric conversion elements arranged adjacent to each other and included in a one pixel is lower than a height of a potential barrier arranged between the first semiconductor regions of the photoelectric conversion elements arranged adjacent to each other and each included in different pixels arranged adjacent to each other, and
wherein each microlens is disposed to overlap a plurality of the first semiconductor regions contained in one pixel with respect to a planar view of the photoelectric conversion unit, and condenses light on the plurality of the first semiconductor regions.

30. The imaging device according to claim 29, wherein a second semiconductor region of the second conductivity type is arranged in at least a portion between the first semiconductor regions of the photoelectric conversion elements arranged adjacent to each other and included in the one pixel, and
wherein an insulator is arranged in a region between the first semiconductor regions of the photoelectric conversion elements arranged adjacent to each other and each included in the different pixels arranged adjacent to each other.

31. The imaging device according to claim 30, wherein a third semiconductor region of the second conductivity type is arranged at a lower part of the insulator.

32. The imaging device according to claim 29,
wherein a second semiconductor region of the second conductivity type is arranged in at least a portion between the first semiconductor regions of the photoelectric conversion elements arranged adjacent to each other and included in the one pixel, and
wherein a third semiconductor region of the second conductivity type is arranged in the region between the first semiconductor regions of the photoelectric conversion elements arranged adjacent to each other and each included in the different pixels arranged adjacent to each other.

33. An imaging device including:
a plurality of pixels, each including a plurality of photoelectric conversion elements, and configured to perform a focus detection based on a phase difference detection at an imaging area by using signals of a plurality of photoelectric conversion elements included in one pixel, and
a plurality of microlens,
wherein each of the plurality of photoelectric conversion elements includes a first semiconductor region of a first conductivity type for collecting a signal charge,
wherein a second semiconductor region of a second conductivity type is arranged between the first semiconductor regions of the photoelectric conversion elements arranged adjacent to each other and included in the one pixel,
wherein a third semiconductor region of the second conductivity type is arranged between the first semiconductor regions of the photoelectric conversion elements arranged adjacent to each other and each included in different pixels arranged adjacent to each other,
wherein an impurity concentration of the second conductivity type of at least a portion of the second semiconductor region is lower than an impurity concentration of the second conductivity type of the third semiconductor region, and
wherein each microlens is disposed to overlap a plurality of the first semiconductor regions contained in one pixel with respect to a planar view of the photoelectric conversion unit, and condenses light on the plurality of the first semiconductor regions.

34. The imaging device according to claim 33, wherein the impurity concentration of the third semiconductor region is three times or more the impurity concentration of the portion of the second semiconductor region.

35. The imaging device according to claim 34, wherein the impurity concentration of the third semiconductor region is ten times or more the impurity concentration of the portion of the second semiconductor region.

36. The imaging device according to claim 33, wherein the second semiconductor region includes a first portion and a second portion, and an impurity concentration of the first portion is lower than an impurity concentration of the second portion, or a width of the first portion is narrower than a width of the second portion with respect to a planar view.

37. The imaging device according to claim 36, wherein the first portion is arranged at a depth different from a depth of the second portion.

38. The imaging device according to claim 36, wherein the first portion is arranged at a position planarly different from the second portion with respect to a planar view of the second semiconductor region.

39. The imaging device according to claim 36, wherein a depth of an impurity concentration peak of the first portion is different from a depth of an impurity concentration peak of the first semiconductor region.

40. The imaging device according to claim 36, wherein the first portion is arranged offset in at least one direction with respect to a projection position of a center position of a microlens on a light-receiving surface.

41. The imaging device according to claim 40, wherein an amount of the offset is 0.1 µm or more.

42. The imaging device according to claim 33, wherein each of the plurality of photoelectric conversion elements is arranged at a different position with respect to a planar view of the photoelectric conversion elements.

43. An imaging system comprising:
a photoelectric conversion device comprising:
a plurality of photoelectric conversion units, each having a plurality of photoelectric conversion elements on which light condensed by one microlens is incident;
wherein each of the plurality of photoelectric conversion elements includes a first semiconductor region of a first conductivity type for collecting a signal charge,
wherein a height of a potential barrier with respect to a signal charge of at least a portion of a region between the first semiconductor regions of the photoelectric conversion elements arranged adjacent to each other and included in a one photoelectric conversion unit is lower than a height of a potential barrier arranged between the first semiconductor regions of the photoelectric conversion elements arranged adjacent to each other and each included in different photoelectric conversion units arranged adjacent to each other,
wherein the imaging system is configured to capture an image based on a signal obtained by adding signals of the plurality of photoelectric conversion elements included in the one photoelectric conversion unit, and
perform focus detection when the image is captured with use of at least one signal of the signals of the plurality of photoelectric conversion elements included in the one photoelectric conversion unit.

44. An imaging system comprising:
a photoelectric conversion device comprising:
a plurality of photoelectric conversion units, each including a plurality of photoelectric conversion elements on which light condensed by one microlens is incident;
wherein each of the plurality of photoelectric conversion elements includes a first semiconductor region of a first conductivity type for collecting a signal charge,
wherein a second semiconductor region of a second conductivity type is arranged between the first semiconductor regions of the photoelectric conversion elements arranged adjacent to each other and included in one photoelectric conversion unit,
wherein a third semiconductor region of the second conductivity type is arranged between the first semiconductor regions of the photoelectric conversion elements arranged adjacent to each other and each included in different photoelectric conversion units arranged adjacent to each other, and
wherein an impurity concentration of the second conductivity type of at least a portion of the second semiconductor region is lower than an impurity concentration of the second conductivity type of the third semiconductor region,
wherein the imaging system is configured to capture an image based on a signal obtained by adding signals of the plurality of photoelectric conversion elements included in the one photoelectric conversion unit, and
perform focus detection when the image is captured with use of at least one signal of the signals of the plurality of photoelectric conversion elements included in the one photoelectric conversion unit.

45. An imaging system comprising:
an imaging device comprising:
a plurality of pixels, each having a plurality of photoelectric conversion elements, each photoelectric conversion element receiving light emitted from a different region of an exit pupil;
wherein each of the plurality of photoelectric conversion elements includes a first semiconductor region of a first conductivity type for collecting a signal charge,
wherein a height of a potential barrier with respect to a signal charge of at least a portion of a region between the first semiconductor regions of the photoelectric conversion elements arranged adjacent to each other and included in one pixel is lower than a height of a potential barrier arranged between the first semiconductor regions of the photoelectric conversion elements arranged adjacent to each other and each included in different pixels arranged adjacent to each other,
wherein the imaging system is configured to capture an image based on a signal obtained by adding signals of the plurality of photoelectric conversion elements included in the one pixel, and
perform focus detection when the image is captured with use of at least one signal of the signals of the plurality of photoelectric conversion elements included in the one pixel.

46. An imaging system comprising:
an imaging device including a plurality of pixels, each including a plurality of photoelectric conversion elements, each photoelectric conversion element receiving light emitted from a different region of an exit pupil;
wherein each of the plurality of photoelectric conversion elements includes a first semiconductor region of a first conductivity type for collecting a signal charge,
wherein a second semiconductor region of a second conductivity type is arranged between the first semiconductor regions of the photoelectric conversion elements arranged adjacent to each other and included in one pixel,
wherein a third semiconductor region of the second conductivity type is arranged between the first semiconductor regions of the photoelectric conversion elements arranged adjacent to each other and each included in different pixels arranged adjacent to each other, and
wherein an impurity concentration of the second conductivity type of at least a portion of the second semiconductor region is lower than an impurity concentration of the second conductivity type of the third semiconductor region,
wherein the imaging system is configured to capture an image based on a signal obtained by adding signals of the plurality of photoelectric conversion elements included in the one pixel, and perform focus detection when the image is captured with use of at least one signal of the signals of the plurality of photoelectric conversion elements included in the one pixel.

47. An imaging system comprising:

an imaging device including a plurality of pixels, each including a plurality of photoelectric conversion elements, and capable of performing a focus detection based on a phase difference detection at an imaging area by using signals of a plurality of photoelectric conversion elements included in one pixel, wherein each of the plurality of photoelectric conversion elements includes a first semiconductor region of a first conductivity type for collecting a signal charge, wherein a height of a potential barrier with respect to the signal charge of at least a portion of a region between the first semiconductor regions of the photoelectric conversion elements arranged adjacent to each other and included in a one pixel is lower than a height of a potential barrier arranged between the first semiconductor regions of the photoelectric conversion elements arranged adjacent to each other and each included in different pixels arranged adjacent to each other, wherein the imaging system is configured to capture an image based on a signal obtained by adding signals of the plurality of photoelectric conversion elements included in the one pixel, and perform focus detection when the image is captured with use of at least one signal of the signals of the plurality of photoelectric conversion elements included in the one pixel.

48. An imaging system comprising:

an imaging device including a plurality of pixels, each including a plurality of photoelectric conversion elements, and capable of performing a focus detection based on a phase difference detection at an imaging area by using signals of a plurality of photoelectric conversion elements included in one pixel, wherein each of the plurality of photoelectric conversion elements includes a first semiconductor region of a first conductivity type for collecting a signal charge, wherein a second semiconductor region of a second conductivity type is arranged between the first semiconductor regions of the photoelectric conversion elements arranged adjacent to each other and included in the one pixel, wherein a third semiconductor region of the second conductivity type is arranged between the first semiconductor regions of the photoelectric conversion elements arranged adjacent to each other and each included in different pixels arranged adjacent to each other, and wherein an impurity concentration of the second conductivity type of at least a portion of the second semiconductor region is lower than an impurity concentration of the second conductivity type of the third semiconductor region, wherein the imaging system is configured to capture an image based on a signal obtained by adding signals of the plurality of photoelectric conversion elements included in the one pixel, and perform focus detection when the image is captured with use of at least one signal of the signals of the plurality of photoelectric conversion elements included in the one pixel.

* * * * *